(12) United States Patent
Dowski, Jr. et al.

(10) Patent No.: US 7,876,417 B2
(45) Date of Patent: Jan. 25, 2011

(54) LITHOGRAPHIC SYSTEMS AND METHODS WITH EXTENDED DEPTH OF FOCUS

(75) Inventors: Edward Raymond Dowski, Jr., Lafayette, CO (US); Gregory E. Johnson, Boulder, CO (US); Kenneth S. Kubala, Boulder, CO (US); Wade Thomas Cathey, Jr., Boulder, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1181 days.

(21) Appl. No.: 11/490,593

(22) Filed: Jul. 21, 2006

(65) Prior Publication Data

US 2010/0259738 A1    Oct. 14, 2010

Related U.S. Application Data

(62) Division of application No. 10/858,337, filed on Jun. 1, 2004, now Pat. No. 7,088,419.

(60) Provisional application No. 60/474,318, filed on May 30, 2003.

(51) Int. Cl.
*G03B 27/00* (2006.01)
(52) U.S. Cl. .............................. 355/18; 355/53; 355/67
(58) Field of Classification Search .............. 250/492.2, 250/492.1; 355/18, 52, 53, 67; 359/558
See application file for complete search history.

(56) References Cited

U.S. PATENT DOCUMENTS

| | | | |
|---|---|---|---|
| 2,959,105 A | 11/1960 | Sayanagi | |
| 5,142,413 A | 8/1992 | Kelly | |
| 5,218,471 A | 6/1993 | Swanson et al. | |
| 5,280,388 A | 1/1994 | Okayama et al. | |
| 5,307,175 A | 4/1994 | Seachman | |
| 5,323,208 A | 6/1994 | Fukuda et al. | |
| 5,337,181 A | 8/1994 | Kelly | |
| 5,348,837 A | 9/1994 | Fukuda et al. | |

(Continued)

FOREIGN PATENT DOCUMENTS

CN    1350193 A    5/2002

(Continued)

OTHER PUBLICATIONS

O'Shea et al., "Chapter 33, Aberration Curves in Lens Design", Handbook of Optics, vol. 1, 1995, pp. 33.1-33.5, McGraw-Hill, NY.

(Continued)

*Primary Examiner*—Kiet T Nguyen
(74) *Attorney, Agent, or Firm*—Lathrop & Gage LLP

(57) ABSTRACT

An optical lithography system that has extended depth of focus exposes a photoresist coating on a wafer, and includes an illumination sub-system, a reticle, and an imaging lens that has a pupil plane function to form an aerial image of the reticle proximate to the photoresist. The pupil plane function provides the extended depth of focus such that the system may be manufactured or used with relaxed tolerance, reduced cost and/or increased throughput. The system may be used to form precise vias within integrated circuits even in the presence of misfocus or misalignment.

8 Claims, 23 Drawing Sheets

U.S. PATENT DOCUMENTS

| | | | |
|---|---|---|---|
| 5,426,521 | A | 6/1995 | Chen et al. |
| 5,438,366 | A | 8/1995 | Jackson et al. |
| 5,555,129 | A | 9/1996 | Konno et al. |
| 5,610,684 | A | 3/1997 | Shiraishi |
| 5,650,632 | A | 7/1997 | Coufal |
| 5,680,588 | A * | 10/1997 | Gortych et al. ............... 716/19 |
| 5,748,371 | A | 5/1998 | Cathey et al. |
| 5,756,981 | A | 5/1998 | Roustaei et al. |
| 5,886,812 | A | 3/1999 | Volk |
| 5,969,853 | A | 10/1999 | Takaoka |
| 6,016,185 | A * | 1/2000 | Cullman et al. ............... 355/52 |
| 6,021,005 | A | 2/2000 | Cathey et al. |
| 6,069,738 | A | 5/2000 | Cathey et al. |
| 6,091,548 | A | 7/2000 | Chen |
| 6,097,856 | A | 8/2000 | Hammond, Jr. |
| 6,144,493 | A | 11/2000 | Okuyama et al. |
| 6,261,727 | B1 | 7/2001 | Wang |
| 6,333,780 | B1 | 12/2001 | Tsukuda |
| 6,404,482 | B1 | 6/2002 | Shiraishi |
| 7,026,081 | B2 | 4/2006 | Van Den Broeke et al. |
| 2002/0118457 | A1 | 8/2002 | Dowski, Jr. |
| 2004/0145808 | A1 | 7/2004 | Cathey, Jr. et al. |
| 2004/0190762 | A1 | 9/2004 | Dowski, Jr. et al. |
| 2004/0228005 | A1 | 11/2004 | Dowski, Jr. |

FOREIGN PATENT DOCUMENTS

| | | |
|---|---|---|
| EP | 0531926 B1 | 3/1993 |
| JP | 08-148411 | 6/1996 |
| WO | WO 02/057832 A2 | 7/2002 |
| WO | WO 03/021333 A1 | 3/2003 |
| WO | WO 03/073153 A1 | 9/2003 |
| WO | WO 2005/054927 A2 | 6/2005 |

OTHER PUBLICATIONS

Poon, et al., "Optical/digital incoherent image processing for extended depth of field", Appl. Opt. vol. 26 (21), Nov. 1, 1987, pp. 4612-4615.

Bradburn et al., "Realizations of focus invariance in optical-digital systems with wave-front coding," Appl. Opt. vol. 36 (35), Dec. 10, 1997, pp. 9157-9166.

Van Der Gracht et al., "Aspheric optical elements for extended depth of field imaging," SPIE vol. 2537, 1995, pp. 279-288.

Ojeda-Castaneda et al., "Spatial filter for increasing the depth of focus," Opt. Lett., vol. 10 (11), Nov. 1985, pp. 520-522.

Ojeda-Castaneda et al., "High focal depth by quasibifocus," Appl. Opt., vol. 27 (20), Oct. 15, 1988, pp. 4163-4165.

Chi et al., "Electronic imaging using a logarithmic asphere," Opt. Lett., vol. 26 (12), Jun. 15, 2001, pp. 875-877.

Marks et al., "Three-dimensional tomography using a cubic-phase plate extended depth-of-field system," Opt. Lett., vol. 24 (4), Feb. 15, 1999, pp. 253-255.

Bartelt et al., "Misfocus tolerance seen by simple inspection of the ambiguity function," Appl. Opt., vol. 23 (16), Aug. 15, 1984, pp. 2693-2696.

Ojeda-Castaneda et al., "Ambiguity function as a design tool for high focal depth," Appl. Opt., vol. 27 (4), Feb. 15, 1988, pp. 790-795.

Ojeda-Castaneda et al., "Annular apodizers for low sensitivity to defocus and to spherical aberration," Opt. Lett., vol. 11 (8), Aug. 1986, pp. 487-489.

Ojeda-Castaneda et al., "Arbitrarily high local depth with a quasioptimum real and positive transmittance apodizer," Appl. Opt., vol. 28 (13), Jul. 1, 1989, pp. 2666-2670.

Ojeda-Castaneda et al., "Arbitrarily high focal depth with finite apertures," Opt. Lett., vol. 13 (3), Mar. 1988, pp. 183-185.

Indebetouw et al., "Imaging with Fresnel zone pupil masks: extended depth of field," Appl. Opt., vol. 23 (23), Dec. 1, 1984, pp. 4299-4302.

Welford, "Use of annular apertures to increase focal depth," JOSA, vol. 50 (8), Aug. 1960, pp. 749-753.

Cathey et al., Image gathering and processing for enhanced resolution, JOSA A, vol. 1 (3), Mar. 1984, pp. 241-250.

Van Der Gracht et al., "Broadband behavior of an optical-digital focus-invariant system," Opt. Lett., vol. 21 (13), Jul. 1, 1996, pp. 919-921.

Hausler, "A method to increase the depth of focus by two step image processing," Opt. Comm., vol. 6 (1), Sep. 1972, pp. 38-42.

Wang et al., "High focal depth with a pure phase apodizer," Appl. Opt., vol. 40 (31), Nov. 1, 2001, pp. 5658-5662.

Sherif et al., "A logarithmic phase filter to extend the depth of field of incoherent hybrid imaging systems," SPIE Proceedings, vol. 4471, Nov. 2001, pp. 272-279.

Pieper et al., "Image processing for extended depth of field," Appl. Opt. vol. 22 (10), May 15, 1983, pp. 1449-1453.

Dowski et al., "Extended depth of field through wavefront coding," Appl. Opt., vol. 34 (11), Apr. 10, 1995, pp. 1859-1866.

Ojeda-Castaneda et al., "High focal depth by apodization and digital restoration," Appl. Opt., vol. 27 (12), Jun. 15, 1988, pp. 2583-2586.

Ojeda-Castaneda et al., "Zone plate for arbitrarily high focal depth," Appl. Opt., vol. 29 (7), Mar. 1, 1990, pp. 994-997.

McCrickerd, "Coherent processing and depth of focus of annular aperture imagery," Appl. Opt., vol. 10 (10), Oct. 1971, pp. 2226-2230.

Greivenkamp, "Color dependent optical prefilter for the suppression of aliasing artifacts," Appl. Opt., vol. 29 (5), Feb. 10, 1990, pp. 676-684.

Hausler et al., "Imaging with expanded depth of focus," Zeiss Inform, Oberkochen, 29 (98E), 1986/1987, pp. 9-13.

Fukuda et al., "A new pupil filter for annular illumination in optical lithography," JJAP, vol. 31, part I, No. 12B, Dec. 1992, pp. 4126-4130.

Fukuda et al., "Spatial filtering for depth of focus and resolution enhancement in optical lithography," J. Vac. Sci. Technol., vol. B9, Nov./Dec. 1991, pp. 3113-3116.

Fukuda et al., "Evaluation of pupil-filtering in high-numerical aperture I-line lens," JJAP, vol. 32, part I, No. 12B, Dec. 1993, pp. 5845-5849.

Chen et al., "Design of the point spread function of a lens, binary phase filter combination and its application to photolithography," Opt. Comm., vol. 119 (1995), pp. 381-389.

Von Bunau et al., "Optimization of pupil filters for increased depth of focus," JJAP, vol. 32, part. 1, No. 12B, Dec. 1993, pp. 5850-5855.

Levinson, "Principles of Lithography," SPIE publications, 2001, pp. 39-40.

Brueck, "Optical and Interferometric Lithography—Nanotechnology Enablers," Proceedings Of the IEEE, vol. 93, No. 10, Oct. 2005, pp. 1-18.

Brueck, Steven R.J.; "There Are No Fundamental Limits To Optical Lighography" International Trends In Applied Optics, pp. 85-109, 2002.

Selected File History from related U.S. Appl. No. 10/858,337, Dec. 7, 2005 through Mar. 16, 2006, 21 pages.

International Search Report from related PCT Patent Application Serial No. PCT/US2004/17508, issued Aug. 19, 2005, 4 pages.

Written Opinion from related PCT Patent Application Serial No. PCT/US2004/17508, issued Aug. 19, 2005, 4 pages.

Office Action & English Translation issued in related CN 200480014933.0, dated Apr. 6, 2007, 14 pages.

Response to Office Action dated Apr. 6, 2007 filed in related CN 200480014933.0, Aug. 21, 2007, 33 pages.

Office Action & English Translation issued in related CN 200480014933.0, dated Mar. 28, 2008, 6 pages.

Response to Office Action dated Mar. 28, 2008 filed in related CN200480014933.0, Jun. 6, 2008, 18 pages.

Supplementary Search Report in related EP 04754175.0, dated Dec. 13, 2007, 12 pages.

Office Action issued in related EP 04754175.0, dated Feb. 7, 2008, 10 pages.

Response to Office Action dated Feb. 7, 2008, filed in related EP 04754175.0, filed Aug. 13, 2008, 5 pages.

Elkind, Dina, et al., "Optical Transfer Function Shaping and Depth of Focus by Using a Phase Only Filter," Applied Optics, vol. 42, No. 11, pp. 1925-1931, Apr. 10, 2003.

Flores, Angel, et al., "Achromatic Hybrid Refractive-Diffractive Lens With Extended Depth of Focus," Applied Optics, vol. 43, No. 30, pp. 5618-5630, Oct. 20, 2004.

Japanese Patent Application No. 2006-523829 Office Action dated May 17, 2010, with English Translation, 9 pages.

European Application No. 04754175.0, Communication Pursuant to Article 94(3) EPC, Sep. 28, 2010, 5 pages.

Japanese Application No. 2006-523829, Translation of Office Action mailed Sep. 22, 2010, 16 pages.

* cited by examiner

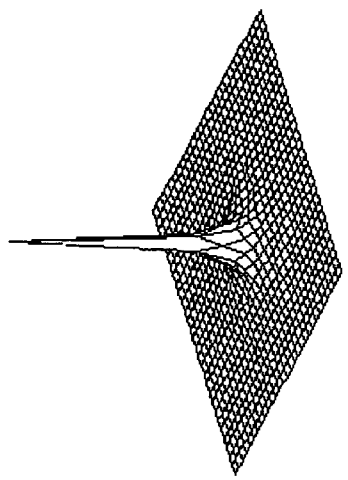
2 waves of misfocus
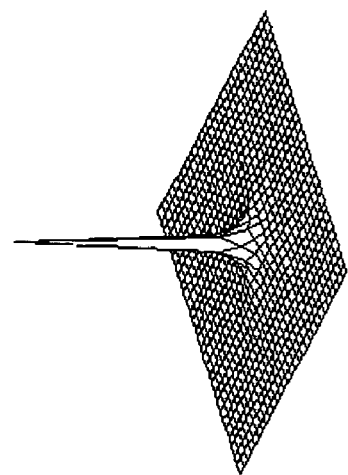
1 wave of misfocus
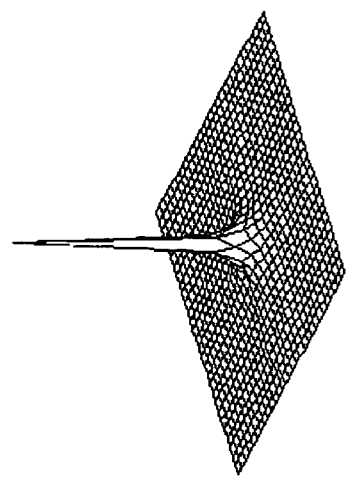
In focus
FIG. 2

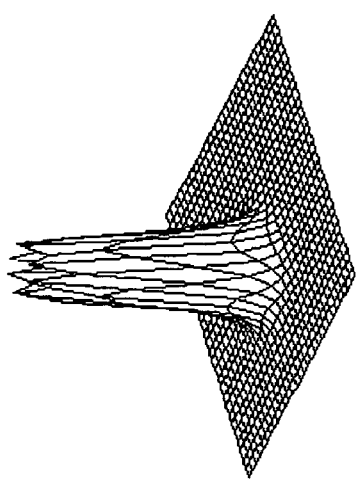
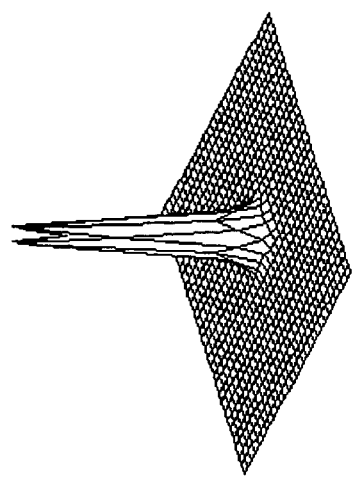
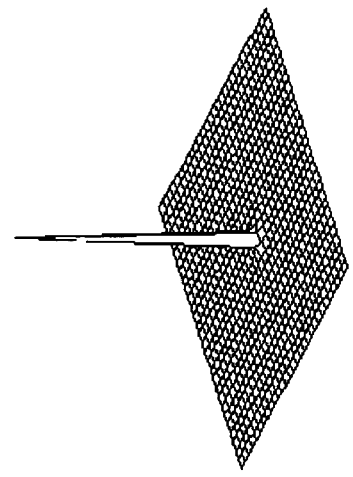
FIG. 3

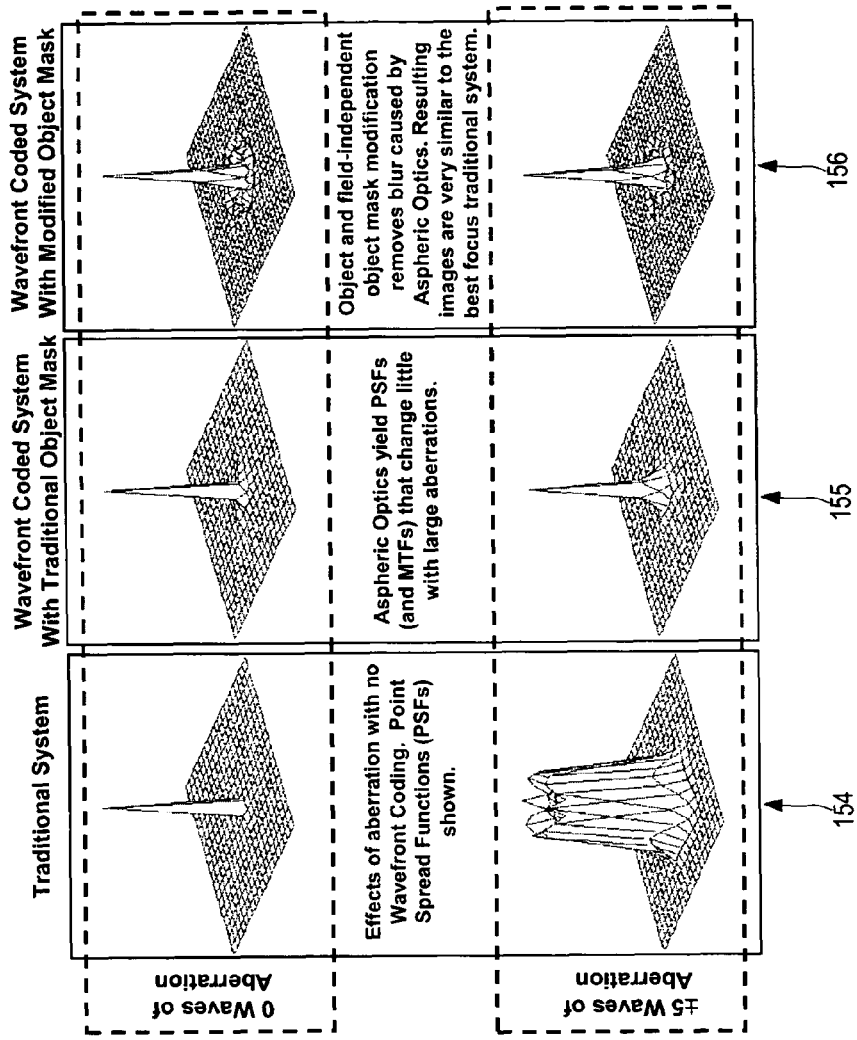
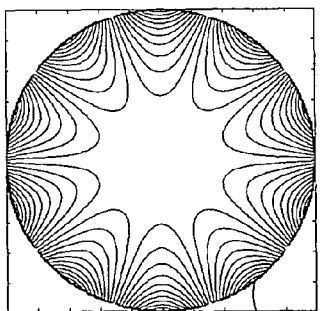
FIG. 8

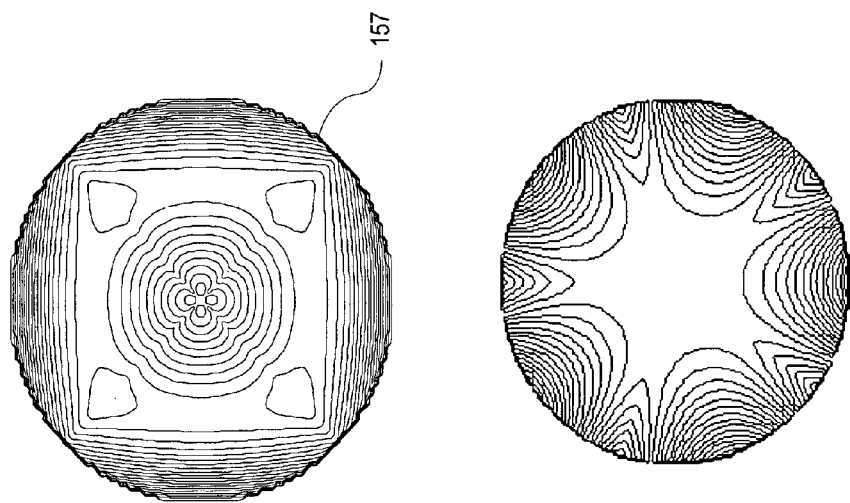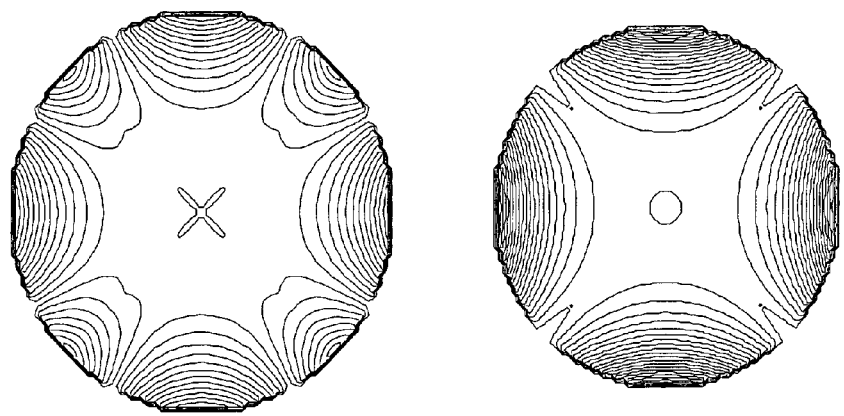
FIG. 9

Mathematical Form:

$$P(r) = \sum a_i r^i, \ i = 3, 4 \ldots 7, \ |r| \leq 1$$

$a = [11.3908 \quad -4.0017 \quad -6.1467 \quad 7.6237 \quad -3.9481]$

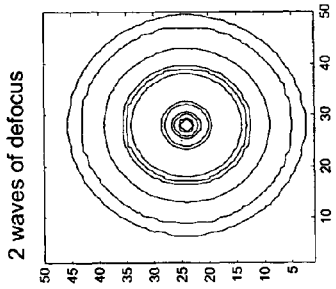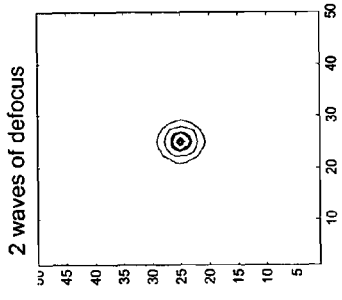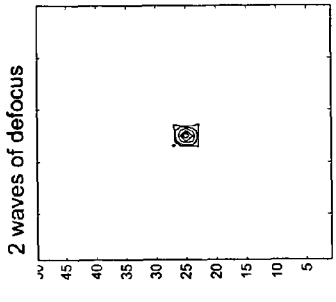
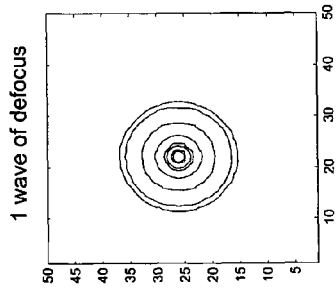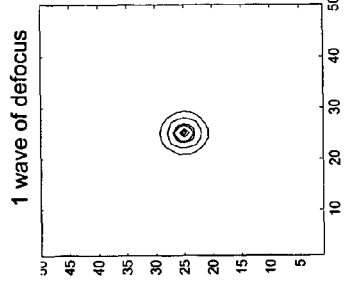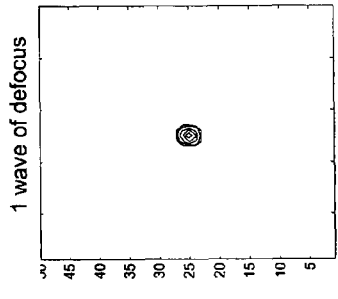
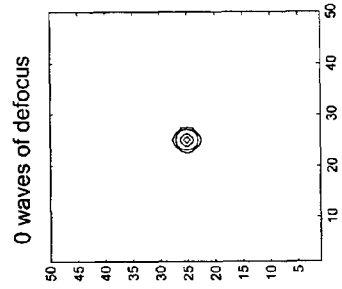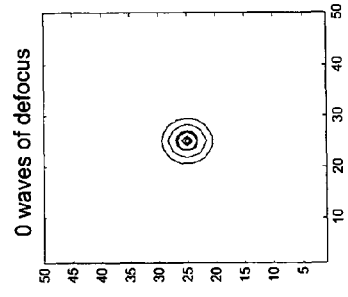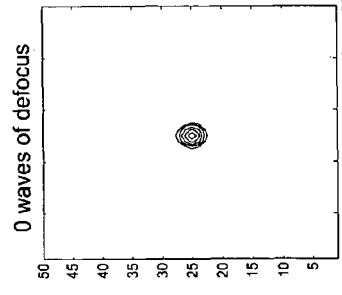
*FIG. 11a*
*FIG. 11b*
*FIG. 11c*

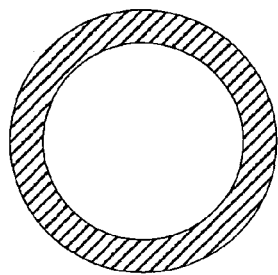
a) conventional
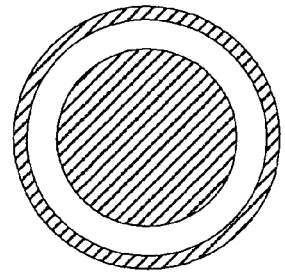
b) annular
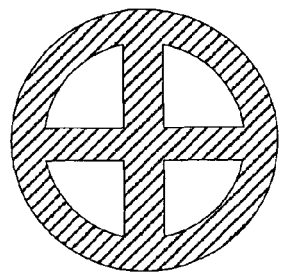
c) "fourfold" source
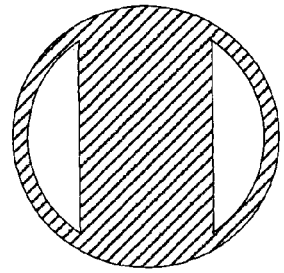
d) "separated" source
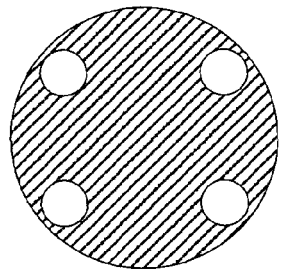
e) quadrupole
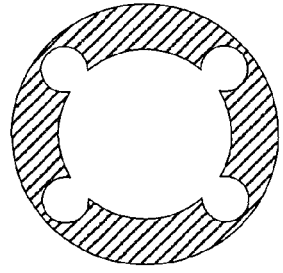
f) "CQUAD"
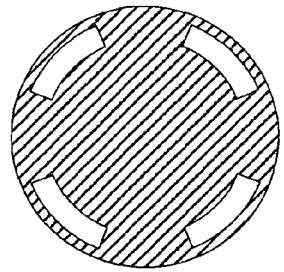
g) "QUASAR"
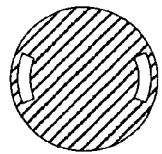 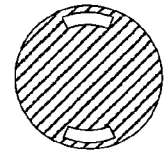
h) Dipole - two exposures and two masks
FIG. 12

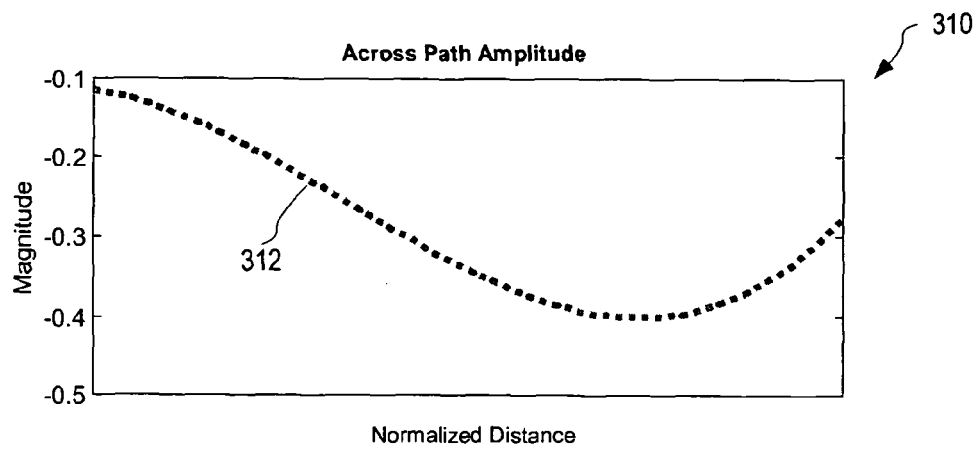
FIG. 30
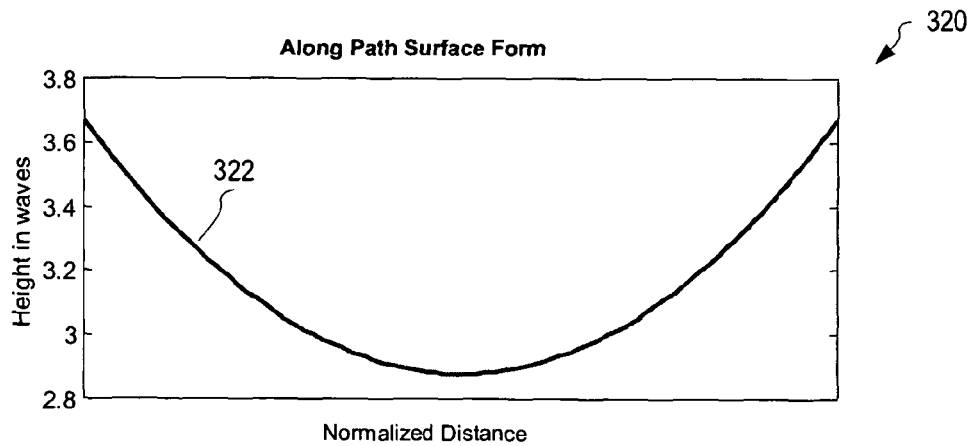
FIG. 31
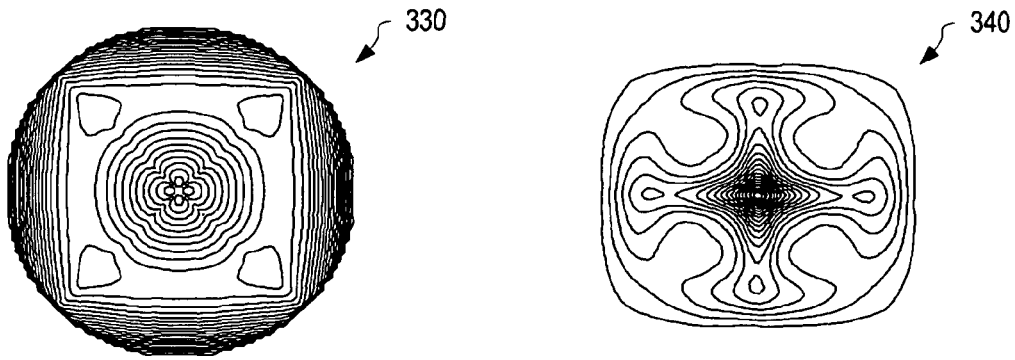
FIG. 32       FIG. 33

LITHOGRAPHIC SYSTEMS AND METHODS WITH EXTENDED DEPTH OF FOCUS

RELATED APPLICATIONS

This application is a divisional application of U.S. patent application Ser. No. 10/858,337, filed Jun. 1, 2004, now U.S. Pat. No. 7,088,419, which claims priority to U.S. Provisional Application Ser. No. 60/474,318, filed May 30, 2003, which is incorporated herein by reference.

U.S. GOVERNMENT RIGHTS

This invention was made with Government support under DAAH01-03-C-R202 awarded by the U.S. Army Aviation and Missile Command. The Government has certain rights in the invention.

BACKGROUND

Semiconductor manufacturing of devices such as integrated circuits relies upon lithography to replicate a pattern onto components (e.g., wafers, substrates, microchips). A traditional optical lithographic system includes an exposure source, illumination optics, an object mask or reticle, photo-resist and process methodology to transfer the pattern from a mask or reticle, to photoresist, and to the components. Although several types of lithography exist, optical lithography remains favored because of its precision and throughput in processing the components with minimum feature sizes. Current optical lithography utilizes short wavelengths (e.g., ultraviolet 193 nm) and high numerical apertures (e.g., Tropel Cheetah employs a numerical aperture (NA) of 0.9) to improve resolution during exposure.

Optical lithography nonetheless adds large cost to a finished semiconductor component, adding approximately one-third to the overall cost. As the operating wavelength decreases to 193 nm to produce reduced feature size, for example at 90 nm, the exposure source and optical components of the lithographic system also increase in complexity and cost. A move to entirely new infrastructures are required when the wavelength is changed.

The semiconductor industry relies heavily on optical lithography. Optical lithographic systems are used to manufacture integrated circuits (ICs) by replicating a pattern onto components (e.g., wafers, substrates, microchips). As the complexity of ICs increases, requirements to produce ever smaller features on the components (and hence in the patterns) are generated. The resolution of optical lithographic systems must therefore increase to allow continued production growth.

In prior art optical lithographic systems, global resolution improvements are made by using immersion with a very high numerical aperture (e.g., NA>1), and/or by decreasing the wavelength of the optical radiation employed. In immersion lithography, a liquid (e.g., ultra-pure water) is used between the lens and the component.

As NA increases, the depth of focus (DOF) decreases with the square of the increase in the NA. For example, from NA of 0.85 to 1.3 immersion, the DOF decreases by a factor of 2.3. As the wavelength of the optical radiation is reduced, the DOF decreases linearly with the decrease in wavelength. An increase in resolution is therefore not useful without adequate DOF.

Nonetheless, as DOF decreases, exposure tools will be required to control focus to an accuracy on the order of tens of nanometers. The reduced DOF raises other issues that include, for example, wafer flatness, wafer warping, thickness of the photo-resist, and reticle flatness. It is clear that the DOF must remain close to currently-used values, while resolution increases, if the performance of optical lithographic systems is to increase without dramatic rise in cost. For example, even though the tolerance on the reticle flatness is reduced by the square of any demagnification, the decrease in DOF requires flatter reticles, thereby increasing the cost of 'mask blank' (reticles prior to patterning) manufacture. Also, stress from chromium deposition during the patterning of the mask blank may also cause it to warp. A further consideration resulting from the decrease in DOF is gravitational effects on the reticle and wafer.

Problems may also occur during use of a reticle when the deposited chromium absorbs radiation, increasing its temperature and causing irregular thermal expansion. Periodic reticle realignment is frequently required, reducing productivity of the optical lithographic system. Non-correctable registration errors become significant for the 100 nm node and beyond.

Lenses form a major part of optical lithographic system cost. The aberrations of Petzval curvature and astigmatism increase proportional to the square of the NA; thus, higher quality (and more expensive) lenses are required to reduce these aberrations since the amount of permissible field curvature will be reduced due to the decrease in DOF. The lens' assembly tolerances are also reduced with a high NA. Thus DOF and focus related aberrations, e.g., field curvature, become major limitations of optical lithography. For example, the field of view of the imaging system, and hence the throughput of the lithography system, is necessarily reduced as NA increases.

With regard to image quality, the two-dimensional modulation transfer function (MTF) of a traditional lens is symmetrical and does not match the distribution of the spatial frequency information of a photo-mask or reticle being imaged. The spatial distribution of an integrated circuit reticle with Manhattan geometries has the bulk of the spatial frequency information along the horizontal and vertical spatial frequency axes. Accordingly, the transfer of the most important spatial frequencies must be maximized in the lithographic imaging system.

Since the 1980s, optical lithography has attempted to employ phase shift masks to improve this problems associated with DOF; however such efforts have not been successful due to increased complexity of the exposure source and optics within the lithographic system. To date, therefore, the prior art efforts to extend the depth of focus have been limited to 15% improvement.

Useful background to the following specification may be found in U.S. Pat. No. 5,348,837 and U.S. Pat. No. 5,748,371, each incorporated herein by reference.

SUMMARY OF THE INVENTION

Systems and methods are provided to increase depth of focus and control focus related aberrations within optical lithography, as compared to the prior art. In certain embodiments herein, such systems and methods further reduce unwanted effects within optical lithography relating to (a) misfocus, (b) misalignment of the semiconductor component and/or mask, (c) thermal changes, and/or (d) optical aberrations such as field curvature (which limits the region of good focus).

Systems and methods are provided that maintain a desired shape of features in the aerial image above the threshold of the lithographic recording medium (e.g., photoresist) over a large range of misfocus, thereby preserving the resolution of the system even with relaxed tolerances of assembly and use. In some cases, the shape of a desired aerial image above a threshold is maintained. In other cases, the numerical aperture (NA) of the system can be increased without reducing the depth of focus. In other cases, the system response of the imaging system can be tailored to match the spatial frequency content of the desired aerial image. In still other cases, the NA of a lens design can be increased to a higher value than in the original design, thereby increasing the resolution without the loss in depth of focus that would normally occur.

In one embodiment, an optical lithography system that has extended depth of focus exposes a photoresist coating on a wafer, and includes: an illumination sub-system, a reticle, and an imaging lens that has a pupil plane function to form an aerial image of the reticle proximate to the photoresist.

In another embodiment, a method constructs a reticle for an optical lithographic system. A phase function is selected to modify a wavefront imaged by the optical lithographic system onto a wafer. An aerial image from the optical lithographic system is determined. A mask-modifying function is generated from the aerial image such that a desired aerial image is formable by the optical lithographic system. The mask-modifying function is determined from the difference between the desired aerial image and the actual aerial image to determine one or both of amplitude and phase components of an object mask. A predicted aerial image based upon imaging of the object mask by the optical lithographic system is determined. The predicted aerial image is applied to a photoresist model to determine an etch pattern. Differences between the etch pattern and a desired etch pattern for the wafer are quantified. If the differences are not within design goals, one or several of (a) the phase function, (b) an optical prescription of the optical lithographic system and (c) the reticle are modified and the steps of determining, generating, applying, and quantifying are repeated until the differences are within the design goals. If the differences are within the design goals, the object mask is utilized to construct the reticle for use in the optical lithographic system.

In another embodiment, a reticle for an optical lithographic imaging system is formed. A phase function is selected to modify a wavefront imaged by the optical lithographic imaging system onto a wafer. An aerial image from the optical lithographic imaging system is determined. A mask-modifying function is generated from the actual aerial image such that a desired aerial image is formable by the optical lithographic imaging system. The modified mask function is used in forming the desired aerial image to determine one or both of amplitude and phase components of an object mask. A predicted aerial image based upon imaging of the object mask by the optical lithographic imaging system is determined. The predicted aerial image is applied to a photoresist model to determine an etch pattern. Differences between the etch pattern and a desired etch pattern for the wafer are quantified. If the differences are not within design goals, one or all of (a) the phase function, (b) an optical prescription of the optical lithographic imaging system, and (c) the illumination are modified, and the steps of determining, generating, applying, and quantifying are repeated until the differences are within the design goals. If the differences are within the design goals, the object mask is utilized to construct the reticle.

In another embodiment, a software product has instructions, stored on computer-readable media, wherein the instructions, when executed by a computer, perform steps for designing a reticle for an optical lithographic system, including: instructions for selecting a phase function modifying a wavefront imaged by the optical lithographic system onto a wafer; instructions for determining an aerial image produced by the optical lithographic system; instructions for generating a mask-modifying function from the aerial image produced by such that a desired aerial image is formable by the optical lithographic system; instructions for applying the mask-modifying function to the desired aerial image to determine one or both of amplitude and phase components of an object mask; instructions for determining a predicted aerial image based upon imaging of the object mask by the optical lithographic system; instructions for applying the predicted aerial image to a photoresist model to determine an etch pattern; instructions for quantifying differences between the etch pattern and a desired etch pattern for the wafer; instructions for modifying one or both of (a) the phase function and (b) an optical prescription of the optical lithographic system if the differences are not within design goals; instructions for repeating the steps of determining, generating, applying and quantifying until the differences are within the design goals; and instructions for utilizing the object mask to construct the reticle for use in the optical lithographic system if the differences are within the design goals.

In another embodiment, apparatus increases the depth of focus in a lithographic system. Optics image a reticle or photomask onto a lithographic recording medium that has a threshold of exposure. A pupil plane function alters the aerial image of the lithographic imaging system such that part of the aerial image is above a recording threshold of the lithographic recording medium over the extended depth of focus. The pupil plane function alters a system response function and the aerial image by affecting phase of a wavefront imaged by the optics.

In another embodiment, a method increases the process window for lithography by: illuminating a reticle and imaging a wavefront of the reticle to an aerial image by altering phase of the wavefront such that aerial image has extended depth of focus and an increased process window size as compared to an aerial image formed without altering of the wavefront phase.

In one embodiment, a method forms a via by: illuminating a reticle having a thickness and defining a hole for the via; and imaging a wavefront of the reticle to an image at a wafer by altering phase of the wavefront such that the image has extended depth of field over the thickness, wherein subsequent etching of photoresist forms the via in the wafer with substantially uniform width.

In one embodiment, a method is provided for forming a via, including:

illuminating a reticle defining a hole for the via; and imaging a wavefront of the reticle to an image at a wafer by altering phase of the wavefront such that the image has extended depth of focus over a desired depth of the via, wherein subsequent etching of photoresist forms the via in the wafer with substantially uniform width over the desired depth of the via.

BRIEF DESCRIPTION OF THE DRAWINGS

FIG. 2 illustrates point spread functions for the optical lithography system of FIG. 1, over varying amounts of misfocus.

FIG. 3 shows point spread functions for a prior art optical lithography system, over the varying amounts of misfocus as in FIG. 2.

FIG. 8 shows one example of an optimized Cosine Form surface that has been designed to be invariant to +/−5 waves of misfocus aberration.

FIG. 9 shows examples of constant profile path elements.

FIG. 11a shows a first set of images illustrating misfocus effects in a traditional imaging system and the corresponding increases in the size of aerial images of a small hole (as for a via on a circuit), resulting in decreased system resolution with misfocus.

FIG. 11b shows aerial images of a small hole with the addition of a pupil-plane phase function over an equivalent range of misfocus shown in FIG. 11a.

FIG. 11c shows images produced with a phase mask/lens combination when imaging an object mask specialized for the particular phase mask.

FIG. 12 shows idealized pupil maps for various conventional and off-axis illumination schemes.

FIG. 30 is a graph illustrating an across-path profile for FIG. 29.

FIG. 31 is a graph illustrating the along-path profile for FIG. 29.

FIG. 32 illustrates one final result of a constant-profile surface, after the addition of a spherical term, that provides extended depth of focus and an Optical Transfer Function (OTF) that matches the spatial frequency information content of images of a Manhattan geometry circuit pattern.

FIG. 33 illustrates the profile of FIG. 32 with lines of constant transmission (for spatial frequencies of the modulation transfer function (MTF)), to match the spatial frequency information content of images of the Manhattan geometry circuit pattern.

DETAILED DESCRIPTION OF THE INVENTION

Figure 1:
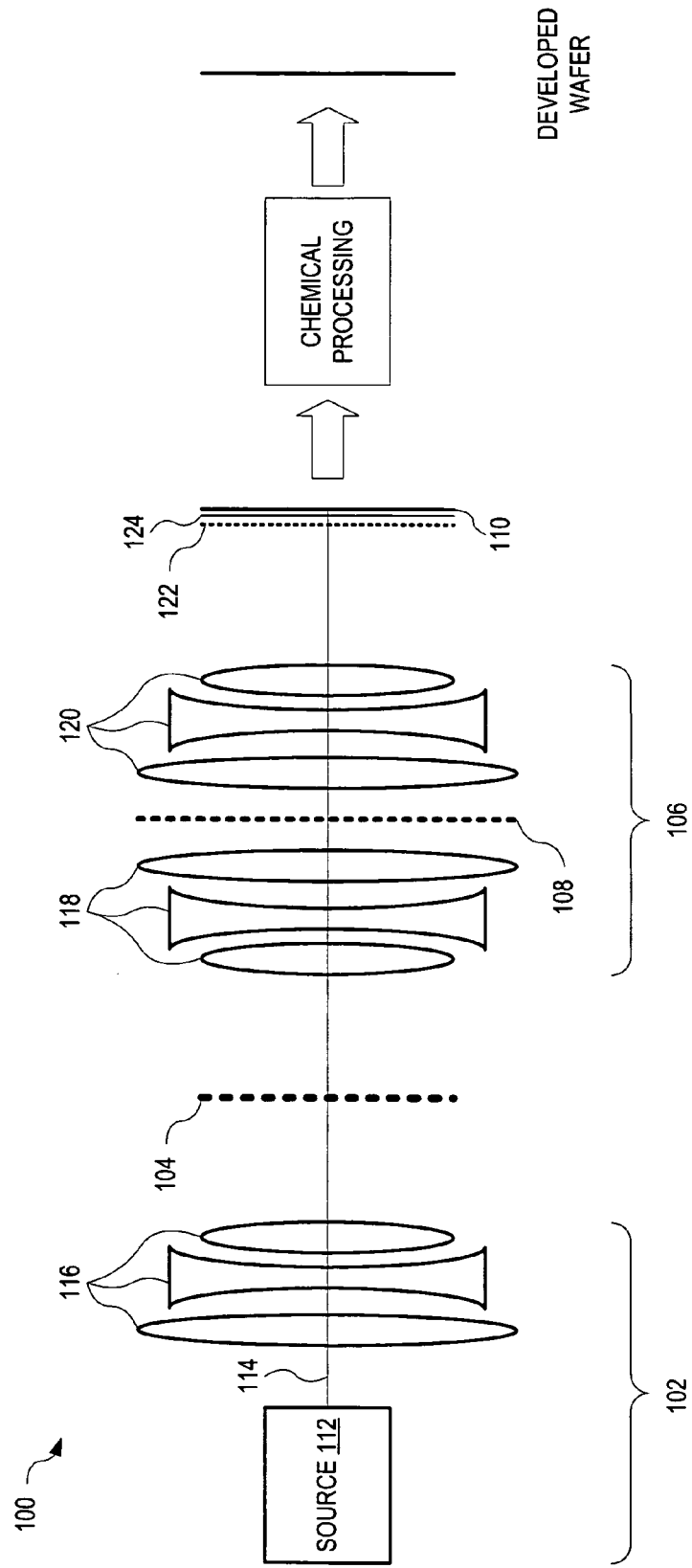
FIG. 1 shows one optical lithographic system with extended depth of focus.

FIG. 1 illustrates an optical lithographic system 100 for extending depth of focus (DOF). System 100 is shown with an illumination system 102, a reticle 104, an imaging lens 106 that implements wavefront coding through a pupil plane function 108, and a wafer 110. Illumination system 102 is shown with an optical radiation source 112 and a lens group 116. Source 112 generates optical radiation 114 that passes through lens group 116, reticle 104 and imaging lens 106, including includes pupil plane function 108, to produce an aerial image 122. Reticle 104 is constructed such that a desired pattern is formed in aerial image 122, as described in more detail below. Imaging lens 106 may include lens groups 118 and 120, as shown. Imaging lens 106 operates to image reticle 104, illuminated by radiation 114, to produce aerial image 122. In one embodiment, radiation 114 is selected from the ultraviolet spectrum.

Lens groups 116, 118 and 120 may, for example, include (a) one or more optical elements (e.g., lenses and/or mirrors) and/or (b) reflective and refractive media (e.g., solids, liquids and/or gasses). Imaging lens 106 may include refractive surfaces, diffractive optics, minors, digital mirrors, digital mirrors (moving quickly with respect to integration time of photoresist), holograms, and volume holograms.

Wafer 110 is coated with a photoresist material 124 that is non-linearly sensitive to optical radiation 114. Photoresist material 124 records no parts of aerial image 122 where optical radiation 114 intensity is below an exposure threshold, and records all parts of aerial image 122 where optical radiation 114 intensity is above the exposure threshold. Photoresist material 124 is thus either 'exposed' or not 'exposed'.

Pupil plane function 108 serves to modify an aerial image from imaging lens 106 such that, even with misfocus at aerial image 122, upper intensity parts of aerial image 122 (i.e., where the intensity of optical radiation 114 at aerial image 122 is above the exposure threshold of photoresist material 124) does not change appreciably with misfocus. Pupil plane function 108 may be implemented through use of a phase plate or other optical element compatible with the wavelength of illumination generated by source 112. Phase changes implemented by the phase plate or optical element may thus be implemented by change in the index of refraction, thickness variations of optical material, spatial light modulation (e.g., use of a digital mirror modulator), or a hologram, for example.

When imaging extended objects, the total interaction of the response for each point on the object forms a total contribution to aerial image 122, and hence the recorded intensity by photoresist material 124. The upper part of the total response is a quantity of interest that will be constrained to follow desired forms, and to remain constant above the exposure threshold through misfocus and other focus-like aberrations, such as described in more detail below.

In one example, misfocus effects may be caused when reticle 104 is not flat; this may occur for example when reticle 104 is warped by thermal effects, has a non-flat substrate, or is positioned with insufficiently tight tolerances within system 100. Misfocus effects may also be caused by incorrect positioning of wafer 110 or if wafer 110 has a non-flat surface. The lower part of aerial image 122, where intensity is below the exposure threshold of photoresist material 124, may vary with this misfocus. In cases where it is necessary to reduce misfocus variation of the lower intensity parts of the image, reticle 104 may be modified to reduce misfocus effects in aerial image 122, such as by applying an equivalent of 'image processing' to reticle 104 rather than to aerial image 122.

In one embodiment, pupil plane function 108 of imaging lens 106 is encoded with an object mask such that the above-the-threshold intensities at aerial image 122 are substantially invariant to misfocus for a range of at least $K*\lambda*f\#/2$, where $K \geq 1.5$, f# is the f-number of imaging lens 106, and $\lambda$ is the wavelength of radiation 114.

To illustrate effects of wavefront coding at pupil plane function 108, the aerial images of a point from system 100, when illuminated with an incoherent source 112, are illustratively shown in FIG. 2 as a function of misfocus. By way of comparison, the aerial images from a traditional optical imaging system, illuminated with a conventional incoherent source but without the pupil plane function of FIG. 1 (and without photoresist processing), are illustratively shown in FIG. 3. The increasing misfocus of FIG. 2 and FIG. 3 may equivalently represent increasing numerical aperture, increasing optical aberration, such as field curvature, and/or increasing misalignment of optics and components. Accordingly, the aerial images of FIG. 2, for optical lithography system 100, are clearly superior as compared to the aerial images of FIG. 3, since system 100 may be manufactured and/or aligned with relaxed tolerance (as compared to the traditional optical imaging system). Thus, each of the aerial images of FIG. 2 are seen by the photoresist at wafer 110.

It should be apparent that corresponding optical system function related to the aerial images of points of FIG. 2 have no zero values in the spatial frequency band of interest, and that the optical system functions related to misfocused traditional optical imaging system of FIG. 3 have numerous regions of zero values. These zero values in the optical system function of the traditional optical imaging system lead to loss of spatial resolution. In contrast, the optical system functions of system 100 have no zeros and thus do not lead to a loss of spatial resolution. In situations where misfocus aberrations lead to unavoidable loss of spatial resolution, system 100 may yield increased spatial resolution. In particular, since the optical system functions of FIG. 2 have no zero values, detected spatial frequencies in the object mask are reproduced in the image and on the photoresist. Thus the object mask is, in effect, pre-compensated so that the formed image is a desired image.

Figure 4:
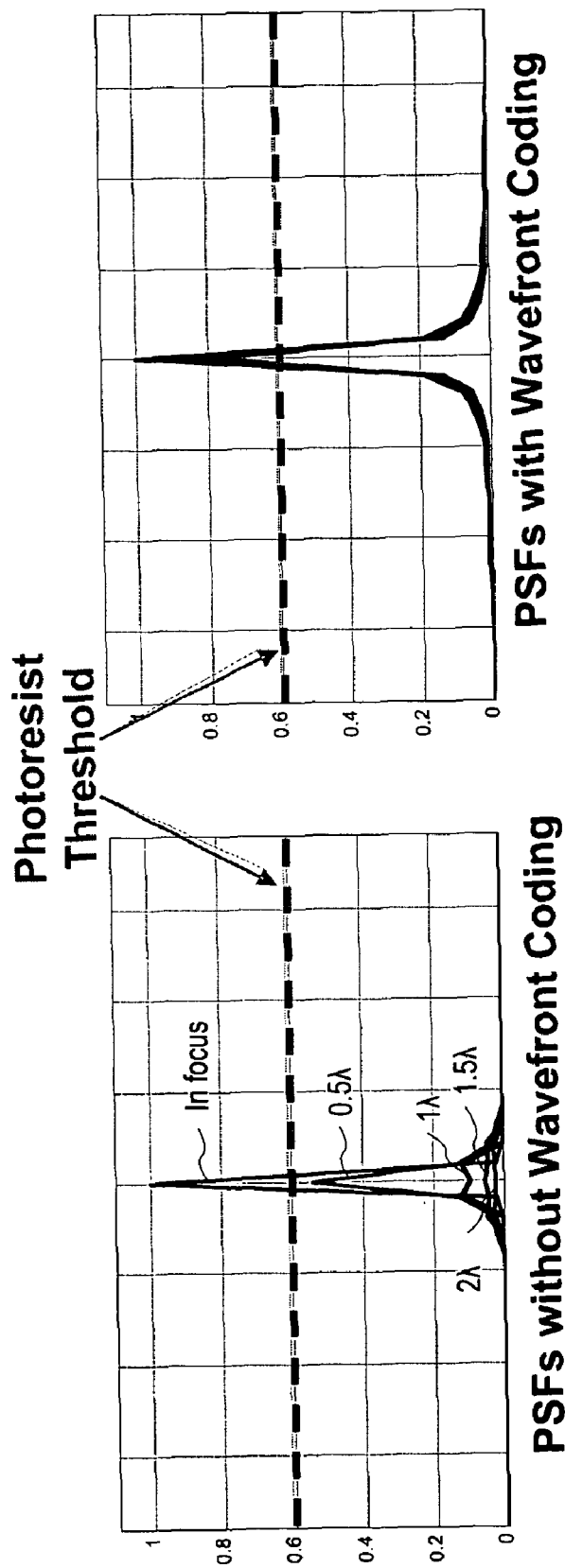
FIG. 4 shows a cross section of the point spread functions of FIG. 2 and a cross section of point spread functions of FIG. 3.

FIG. 4 shows the cross sections of the aerial images of the small hole from FIG. 2 and FIG. 3, without normalization, to show that in addition to being out of focus, the peaks of the aerial images of FIG. 3 with moderate and large misfocus would be too low to expose an image. From FIG. 3 it is clear that the cross sections of the aerial images of the traditional optical imaging system vary dramatically, while the cross sections of the aerial images (from system 100) are essentially the same. Given a photoresist model (described more below) with photoresist processing simulated with a threshold of 0.6, the aerial images of FIG. 2 are substantially indistinguishable from the in-focus aerial image of FIG. 3; the spreading at the base of the aerial images (FIG. 2) is not large enough to expose the photoresist area outside of the peak. Since the photoresist essentially acts like a step function, the extended "bases" of the aerial images (FIG. 2) are unexposed and not visible in the resulting, processed wafer 110.

Because the aerial image of FIG. 4 is of a small hole (i.e., aperture), the image of this example also illustrates the point spread function (PSF) of system 100, as labeled. With the extended depth of focus, this PSF produces a precise hole in depth within photoresist material 124, providing a useful way to form an electrical via (e.g., providing power or ground) within an integrated circuit (IC).

In one embodiment, and with further regard to FIG. 1, the design of optical lithography imaging system 100 is made through trade-off of characteristics associated with illumination system 102, an object mask used to form reticle 104, and the phase mask which forms pupil plane function 108. These trade-offs, and constraints, are discussed in more detail below.

The object mask may have a phase component and an amplitude component, such that aerial image 122 forms the desired image after photoresist processing. As an example, if there are no constraints on design or fabrication of the object and phase masks, and there were no zeros in the optical system function of system 100, then for at least some classes of illumination, such as incoherent illumination, an approximate closed-form solution to the masks is determinable by: calculating the spatial phase and amplitude response required to form a diffraction-limited point aerial image from a phase-modified optical imaging system and then convolving this spatial phase and amplitude response with a scaled version of the desired image. The phase-mask-modified optical system may be constructed and arranged such that the point aerial image of the system has an increased depth of focus or depth of field when compared to an imaging system without a phase mask and, for example, such that no zeros exist within the corresponding optical system function. With incoherent illumination, the spatial amplitude system response used to form a diffraction-limited point image can be considered a "spatial filter" that changes the object mask for the specific phase mask.

For partially coherent illumination, the object mask is not modified through linear convolution but in a manner, dependent on spatial coherence, such that the proper aerial image is formed. Mutual coherence functions may also be used in partially coherent systems, representing the object mask, desired image, and system response, to synthesize a modified object mask in an analogous manner.

Given the null space shared by the aerial image at the detected image, many "spatial filters" may be determined that form a suitable aerial image and that produce the desired image after photoresist processing. This "spatial filter" is thus applied to the object mask so that the form of the mask changes and such that the new aerial image does indeed form the correct detected image, increasing spatial resolution and reducing the adverse effects of misfocus. Refinements of the foregoing lead to constraints on the modification of the object mask so that only a small fixed number of amplitude and/or phase steps/levels are allowed.

Figure 5:
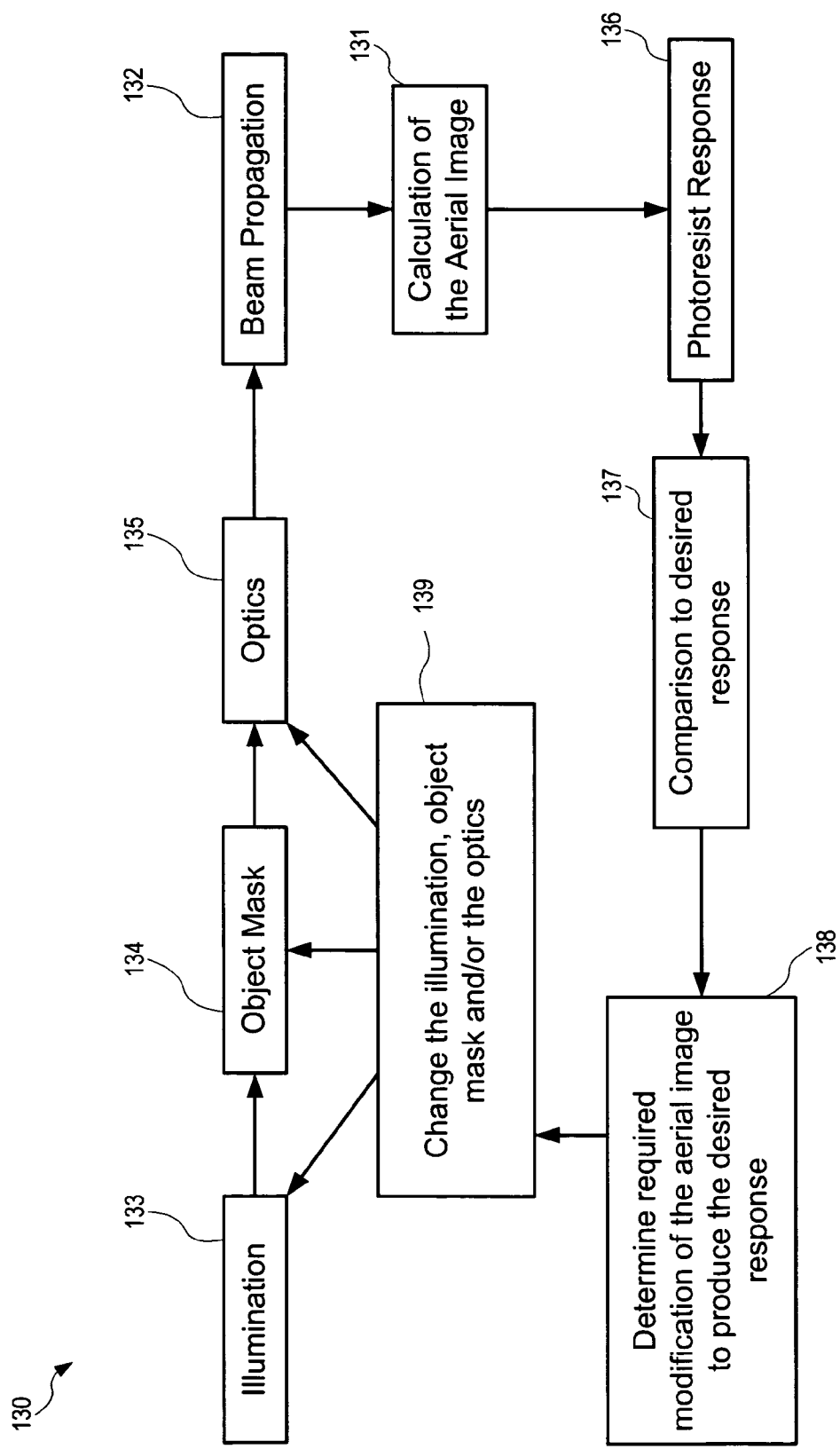
FIG. 5 shows one process for constructing the optical lithography system of FIG. 1.

One process 130 for constructing optical lithography system 100, FIG. 1, is thus shown in FIG. 5. Process 130 starts with the calculation 131 of the aerial image over an imaging volume that may include field of view, dynamic or static aberrations and/or depth of field/depth of focus. The aerial image is calculated 131 by propagating 132 a beam from the illumination source 133 (e.g., source 112, FIG. 1) through the object mask 134 and optics 135 (e.g., imaging lens 106) to the wafer plane. A physical propagation mode may be used, rather than a geometric mode, to accurately handle diffraction, interference and polarization effects. The recorded image after photoresist processing is then determined 136 based on the aerial image intensity distribution. If the image resulting from the non-linear photoresist response matches 137 the image goal, then the optimization completes. If not, the aerial image is modified 138 to meet the goal, and the information contained in the aerial image is used to modify 139 the illumination 133, the pupil function (e.g., the phase mask forming pupil plane function 108 of FIG. 1), and/or the object mask 134. The loop of process 130 repeats until a satisfactory solution is found.

There may be benefits to the joint optimization process 130 of FIG. 5. For example, a small number of parameters describe the design problem through parameterization of the optical imaging system models, phase mask, and related object mask variations. In one embodiment, the pupil function 108 (or phase mask) is designed such that the focus produced by optical lithography system 100 is substantially invariant to a range of system misalignment and/or optical aberrations such as field curvature. The aberration invariance is then used to determine the increase in field, increase in alignment tolerance and/or increase in numerical aperture to design system 100. Using an aberration model that increases to the $4^{th}$ order with numerical aperture, aberration invariance of system 100 can yield at least a 20-30% increase in the numerical aperture (as compared to prior art traditional optical imaging systems). Using a second order field curvature model, the instantaneous field of system 100 increases (over the prior art) by a factor of at least 1.5 (and even up to, for example, a factor of about 8), which is in proportion to the square root of the system's depth of focus increase shown in FIG. 2. This increases the overall throughput achievable by the system of FIG. 1.

Figure 6:
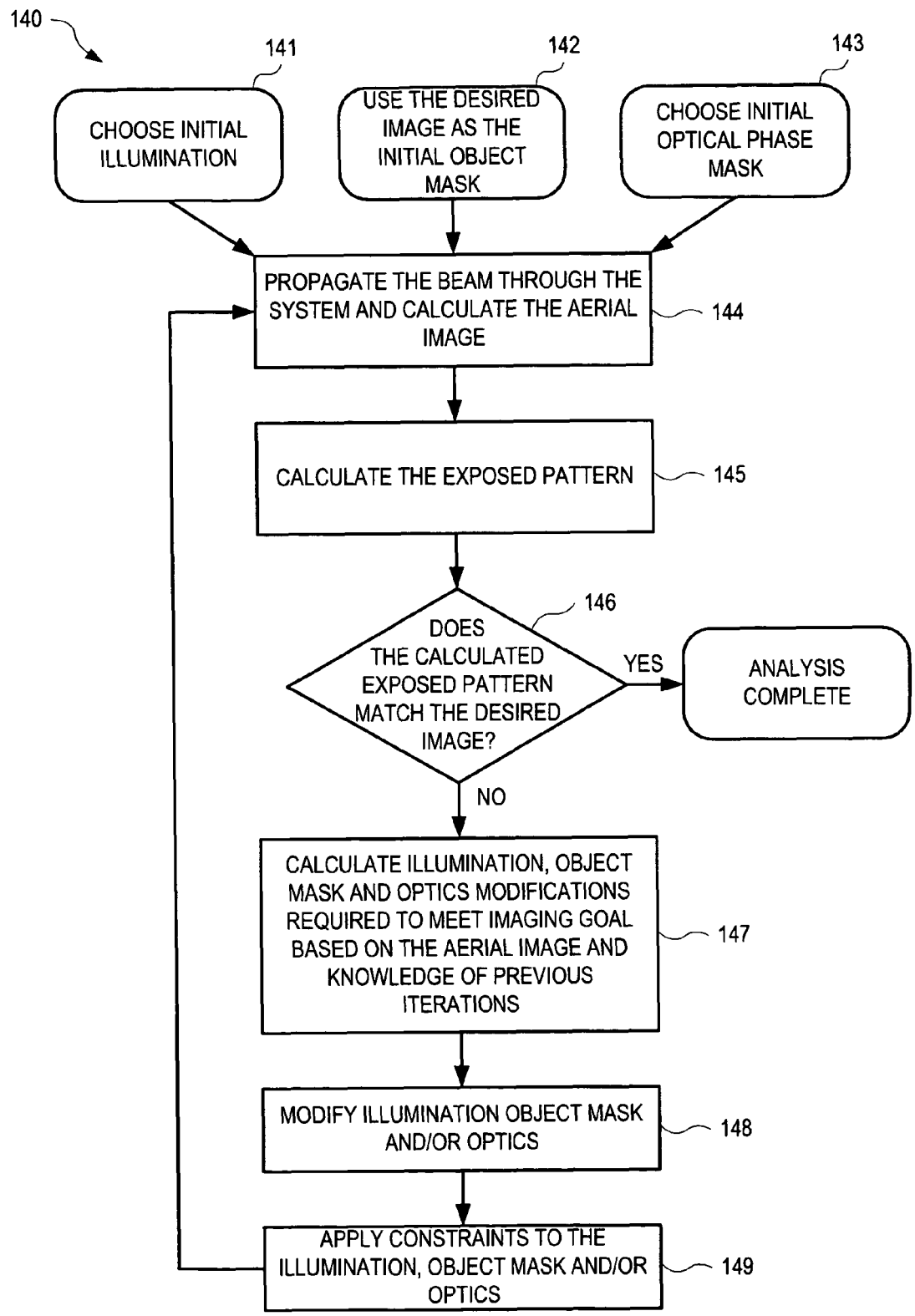
FIG. 6 shows one process for designing elements of the optical lithography system of FIG. 1.

More particularly, FIG. 6 shows one process 140 for designing elements of system 100. In step 141, the illumination system (e.g., system 102) for optical lithography system 100 is selected. The illumination system may change as part of the optimization of process 140, if desired. The selection of the illumination system for example includes selecting source configuration, degree of coherence, angle of illumination, irradiance at the object mask, and/or other factors. In step 142, an initial object mask is calculated, by scaling the desired final image by the system magnification. The object mask is later modified to "undo" effects caused by optical lithography system 100 to reach desired invariance to certain aberrations that limit performance. In step 143, the phase function family and initial parameters of the phase mask are selected. One example of step 143 is to select optics and a phase mask (collectively, lens group 106 and pupil plane phase function 108 of FIG. 1) that operate to extend the depth of field/depth of focus and misfocus aberrations and tolerances expected by optical lithography system 100. The phase mask selected in step 143 may change as part of the optimization of process 140, if desired. Once the initial optical lithographic system is selected, the aerial image is determined in step 144, as defined by beam propagation from the illumination system, through the object mask and imaging lens (including the phase mask). The determination of the aerial image can include polarization and coherence effects associated with the illumination source. In step 145, the photoresist response is calculated by applying a non-linear thresholding (a photoresist "model") to the aerial image. In step 146, a figure of merit (quantifying the degree of optimization of the optical lithography system) is used to determine if the exposed image is sufficiently close enough to the ideal image; the figure of merit for example may include a least squares analysis. If the desired degree of optimization is sufficient ("Yes"), the optimization of process 140 ends; if not ("No"), the optimization of process 140 continues with steps 147, 148, 149. Based on the variables calculated in previous iterations, and based on the aerial images, new system variables are calculated. For example, in step 148, the illumination source, object mask and/or optics (lens group 106) are changed and a new figure of merit is determined (steps 144, 145, 146). In a further optional step 149, constraints may also be applied to the variables. For instance, in one example of step 149, the object mask is allowed only to have finite phase and amplitude steps.

Upon reading and fully appreciating this disclosure, one skilled in the art appreciates that the order of steps in FIG. 6 may be altered to provide like results, without departing from the scope hereof.

In another example, optimization of optical lithography system 100 of FIG. 1 may include the following steps:

1) Select a pupil-plane phase function (for example by selecting a phase function from a "family" of phase functions described below).

2) Select an optical prescription of imaging optics (to image the object mask to aerial image 122) and the illumination system 102.

3) Determine the system response of the optical prescription.

4) Determine the object mask-modifying function from the system response from step 3. The object mask-modifying function is chosen so that fundamental images, such as points, lines, edges, etc., are formed at aerial image 122 given the particular system response.

5) Apply the object mask-modifying function (from step 4) to the desired aerial image to determine a modified-object mask. This step 5 can depend on the illumination used.

6) Determine aerial image 114 formed by the modified object mask of step 5.

7) Apply the aerial image from step 6 to a photoresist model to determine the etch pattern on the wafer (i.e., aerial image 114 impinges on photoresist material 124 to expose and form the etch pattern; at this stage, aerial image 114 and the etch pattern are not identical due to non-linear effects in the exposure of photoresist material 124).

8) Compare the etch pattern of step 7 to the desired pattern, for example by using an error matrix (e.g., least squares determination) comparing the etch pattern with the desired final pattern.

9) Modify (e.g., iterate) the phase function of step 1 and/or the optical prescription of step 2 and perform steps 3-8 until the error matrix is within acceptable limits (e.g., until the etch pattern is sufficiently close to the desired pattern).

In step 6, the determination of aerial image 122 may for example include the degree of coherence of the wavefront from the object mask to the aerial image. For example, the mutual coherence function may be used to determine the aerial image, as determined, for example, by the physical form of illuminating source 112 and the spectral width. This process optimization can also be enhanced, for example, to include constraints for the object mask (similar to step 149, FIG. 6). Accordingly, here is another optimization process suitable for use in designing system 100, FIG. 1:

1) Select a phase function (for example by selecting a phase function from a "family" of phase functions described below.
2) Select an optical prescription of the imaging optics (to image the object mask to the aerial image) and the illumination system (e.g., system 102).
3) Determine the system response of the optical prescription.
4) Determine a modifying mask function from the system response from step 3.
5) Apply the modifying mask function (from step 4) to the desired final pattern to determine a modified object mask. This step 5 can depend on the form of the illumination used.
6) Quantize the object mask of step 5 to apply practical constraints to manufacturing the object mask (for example, to limit the object mask to discrete phase and/or amplitude steps).
7) Determine the aerial image formed by the object mask of step 6.
8) Apply the aerial image from step 7 to a photoresist model to determine etch pattern on the wafer.
9) Compare the etch pattern of step 8 to the desired final pattern, for example by using an error matrix (e.g., least squares determination) comparing the etch pattern with the desired pattern.
10) Modify (iterate) the phase function of step 1 and/or the optical prescription of step 2 and perform steps 3-9 until the error matrix is within acceptable limits (e.g., until the etch pattern is sufficiently close to the desired pattern) and/or until the object mask may be constructed within practical limits.

In step 7, the determination of the aerial image may for example include the degree of coherence in the wavelengths forming the wavefront from the object mask to the aerial image. For example, the mutual coherence function may be used to determine the aerial image.

In the above processes, the determination of the aerial image may also include consideration of the illumination scheme associated with illumination system 102. For example, the illumination scheme may include off-axis illumination, quadruple illumination, or other illumination techniques.

Certain advantages may be realized by the systems and methods described herein. For example, by extending the depth of focus, the usable field of view of the imaging system may be increased by reducing the system effects of field curvature. Increasing the field of view increases the throughput (number of wafers per unit time) associated with optical lithographic system 100 (e.g., the throughput may increase by approximately a factor of $(K)^{1/2}$, since the imaging volume from the object mask to aerial image 122 may increase by the K factor). Moreover, in that the depth of focus increases, the manufacture and/or alignment of the object mask, optics, and/or illumination system may be made with reduced tolerance (as compared to the prior art). Similarly, the accuracy to which wafer 110 and/or reticle 104 moves within the optical lithography system may also be reduced, permitting faster speed (e.g., associated with stepper motors and the like that translate the wafer and/or object mask) and increasing wafer throughput. In one example, K equals 1.5. Further improvement is achieved with K exceeding 2, 3, 4, 5, 6, 7, 8 or more; however increasing K possibly complicates manufacture of the phase mask (used to form the pupil plane function 108) and the object mask (used to form reticle 104). The modification of the reticle or photomask may be dependent upon the form of the illumination source, and whether the illumination (generated by source 112) is coherent, partially coherent, or polarized.

In the above-described processes and optimizations, the selection of the pupil-plane phase function associated with the phase mask may include selecting a phase function from a family of phase functions, such as the cosine form family or the constant profile path family now described.

Figure 7:
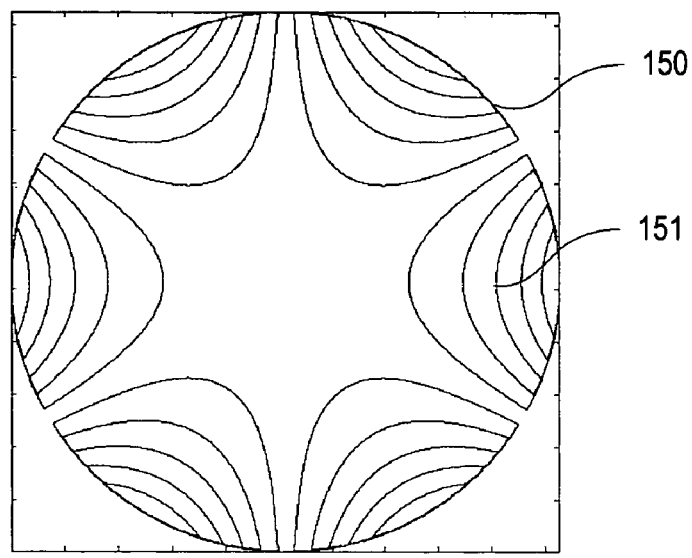
FIG. 7 shows one specialized Cosine Form surface illustrating lines of constant phase.

The Cosine Form Family—Surfaces from the Cosine Form family allow precise control of misfocus aberrations. Additionally, Cosine Form systems can have circularly symmetric MTFs, which lead to high uniform MTFs. The general form of the Cosine Form function is given by: $P(r,\theta)=\Sigma a_i r^i \cos(w_i\theta+\phi_i)$ where r and θ are the radius and angle in polar coordinates and φ is an angular phase shift. The radian phase terms $w_i$ can all have zero value for some systems. Another specialized form is $P(r,\theta)=f(r)\cos(w\theta+\phi)$. For example, one specialized Cosine Form surface 150 is shown in FIG. 7, which shows lines 151 of constant phase. An example of an optimized Cosine Form surface 153 that has been designed to be invariant to +/−5 waves of misfocus aberration is shown in FIG. 8. The performance of the optimized Cosine Form surface is demonstrated, in FIG. 8, which shows: PSFs 154 of a traditional optical imaging system, PSFs 155 of system 100 employing cosine form surface 153 and a conventional object mask, and PSFs 156 of system 100 employing cosine surface 153 and a modified object mask (e.g., a modified mask as implemented through the above-described optimization processes).

The Constant Profile Path (CPP) Family—Constant Profile Path surfaces may be used where more control is required in complex optical digital designs, as compared to Cosine Form surfaces. This characteristic can be engineered to work optimally with modifications of the object mask. The surface heights of CPP surfaces are defined along paths where the functional form, or profile, of the surface is the similar along normalized versions of the paths. The actual surface height varies from path to path, but the functional form or profile along a normalized path does not need to. Examples of CPP elements are shown in FIG. 9; for example one CPP element 157 has a square functional form. One effect of designing systems with the CPP family is that systems employing CPP pupil-plane phase masks can produce results that have a low variability to misfocus-like aberrations and compact PSFs.

Figure 10:
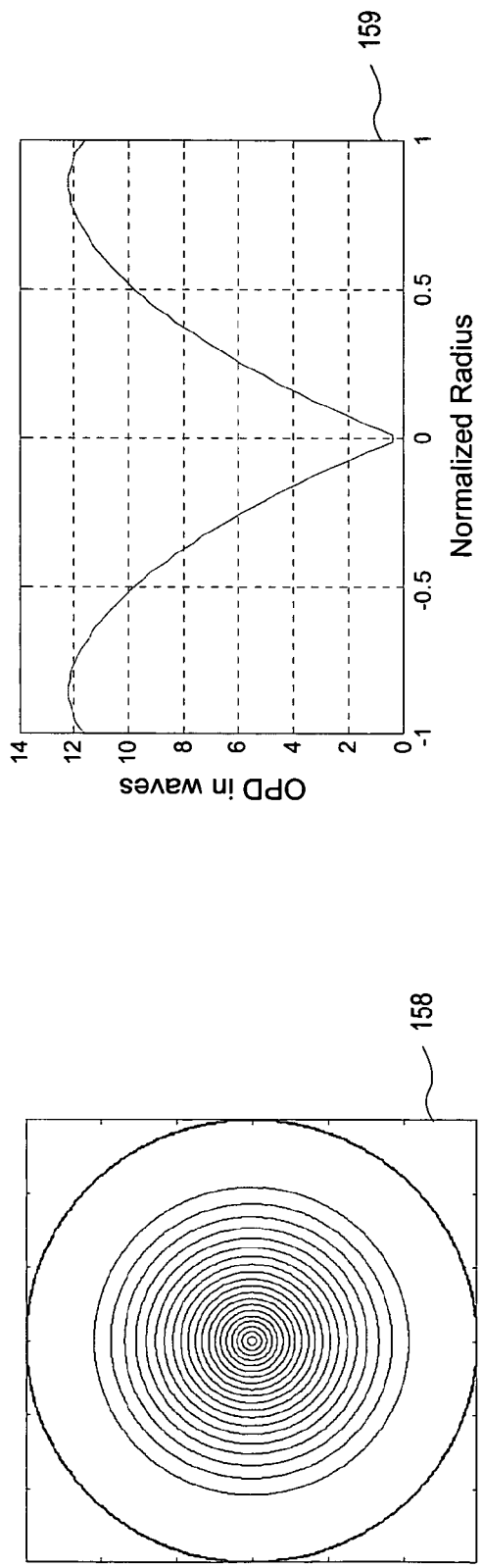
FIG. 10 shows a surface profile of one modification made to an ideal optical projection lens.

FIGS. 10, 11a, 11b and 11c illustrate one example of using an object mask for a via, or hole, in an optical lithographic system with a depth of focus of $K*\lambda*f\#/2$, where K equals 8. The misfocus range shown in this example is 0 to +2 waves. The results are identical for a misfocus range of 0 to −2 waves. In particular, FIG. 10 shows a surface profile 158 of the modification made to an ideal optical projection lens (e.g., for use as imaging lens 106 of optical lithographic system 100). This modification can be considered as the addition of an ideal "phase mask" placed at or near the aperture stop of the ideal lens, for example to form pupil plane function 108, FIG.

1. A functional form of the phase mask is provided as P(r), which may be generated through optimization (e.g., FIG. 6) on a phase function family to create an increased tolerance to misfocus of +/−2x. Graph 159 shows the optical path difference (OPD) of profile 158 as a function of normalized radius for the lens.

FIG. 11*a*-11*c* show idealized simulations of aerial images using a linear system model for the lithographic system when illuminated with an incoherent source, with the imaging lens modeled as diffraction-limited at best focus. Specifically, FIG. 11*a* shows a first set of images illustrating misfocus effects in a traditional optical imaging system and the corresponding increases in the widths of aerial images of a point, resulting in decreased system resolution with misfocus. A second set of images in FIG. 11*b* shows aerial images of a point with the addition of the phase mask (P(r)) over an equivalent range of misfocus. A third set of images in FIG. 11*c* shows the best images produced with the phase mask/lens combination when imaging an object mask specialized for the particular phase mask; the aerial images of the object mask are essentially identical to the aerial images of a point at best focus of the traditional imaging system. Even with large amounts of misfocus, the image of the specialized object mask is essentially as good as the best-focus aerial images of a point from the traditional system. FIG. 11*c* demonstrates invariance to misfocus and diffraction-limited imaging of specialized objects over the misfocus range of +/−2λ.

FIG. 12 shows a series of idealized pupil maps (a)-(h) for various on-axis and of axis illumination schemes. For example, pupil map h corresponds to two pupil maps that require double exposure and two masks.

Figure 13:
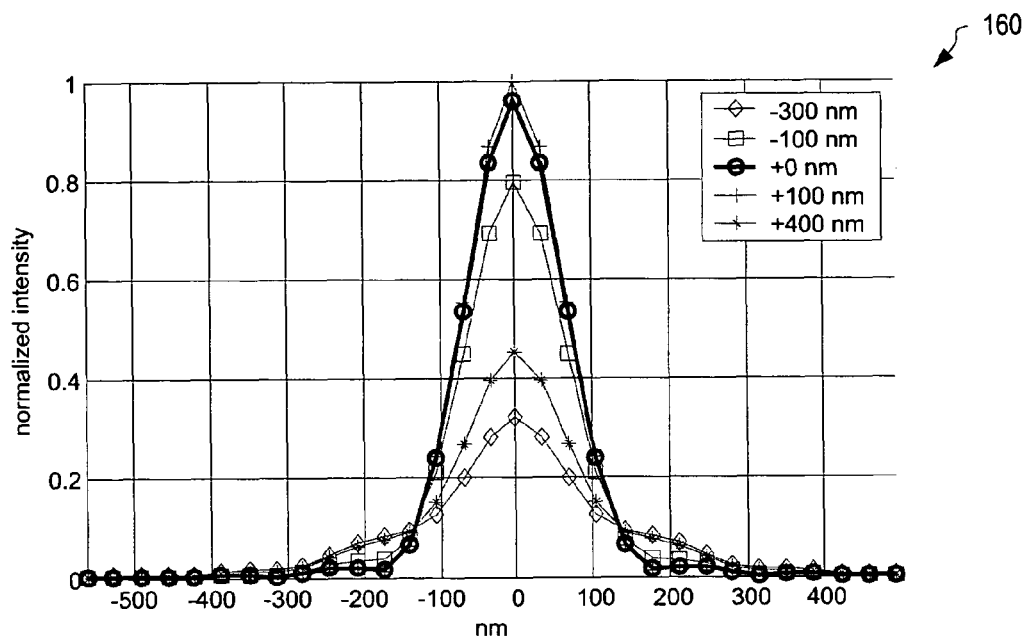
FIG. 13 is a graph illustrating through-focus aerial images of a small hole of a prior art system with a numerical aperture (NA) equal to 0.7.

FIG. 13 is a graph 160 illustrating through-focus aerial images of a point within a prior art system having a NA equal to 0.7. Graph 160 shows intensity variation resulting from misfocus in a traditional lithographic system. Each line of graph 160 represents the aerial images of a point for a given misfocus distance. The width of the aerial images of a point is shown in nanometers in the x-axis and the misfocus is shown in nanometers. If an exposure threshold is set at 0.6, for example, the size of a recorded 'spot' would vary excessively as a function of misfocus; recordation may not appear at all in certain cases. As shown in graph 160, the depth of focus (e.g., the range of misfocus where a usable image is formed) is so small that the image of the reticle may not be in focus for tolerances of current lithographic systems.

A rotated quadrupole illumination (see FIG. 34) with a wavelength of 193 nanometers (nm) and an imaging lens with a NA of 0.7 is used in certain of the illustrative simulations below, except where noted. The rotated quadrupole illuminator (called rotated since typical or non-rotated quadrupole illuminators have apertures placed on their diagonals) was designed as a 256×256 sized grid with clear aperture (or "hole") placed (centered) at the grid points (4,128), (252, 128), (128,252), (128,4) where the point (1,1) is defined as "origin" and is in the upper-left corner of the matrix, and where a "hole" in these particular simulation is defined as having zero phase and transmittance:

hole=

| 0 | 0 | 0 | 1 | 0 | 0 | 0 |
| 0 | 1 | 1 | 1 | 1 | 1 | 0 |
| 0 | 1 | 1 | 1 | 1 | 1 | 0 |
| 1 | 1 | 1 | 1 | 1 | 1 | 1 |
| 0 | 1 | 1 | 1 | 1 | 1 | 0 |
| 0 | 1 | 1 | 1 | 1 | 1 | 0 |
| 0 | 0 | 0 | 1 | 0 | 0 | 0 |

Alternative illuminator designs—such as annular, other regular, prescribed or irregular geometries—may also be used. The simulations included herein were made using CodeV of Optical Research Associates. The illumination was modeled using a CodeV interferogram file input with a partial coherence (PAR) model. The file was used with the sequence command "SRC <filename> 2.0" where 2.0 represents the relative size of the illuminator (refer to CodeV for definition of 'relative'). Other illuminator designs with a variety of angular orientations and window geometries, including polarization, phase and amplitude control, may be equally used.

Figure 14:
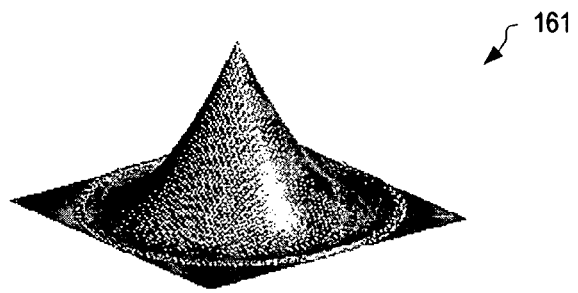
FIG. 14 is a graph illustrating a pupil plane phase function used to provide consistent above-exposure threshold intensity of an aerial image of a small hole.

FIG. 14 is a graph 161 illustrating one example of the cosine form of a pupil plane function 108, FIG. 1, as used with wavefront coding to extend the depth of focus of optical lithographic system 100. The equations for the surface of pupil plane function 108 (including pertinent parameters used in Code V) are shown below where the first equation is for a numerical aperture of 0.7, and the second equation is for a numerical aperture of 0.8.

Pupil Plane Function Equation $P(r, \theta) = (Y/R)\Sigma a_n r^n$, where n=1 . . . 9, and radius $|r|<=1.0$, and angle $\theta=0$ . . . $2\pi$, where $a_n$=[4.6967−2.7162 1.7921 −0.7771 −0.5688 −1.3528 0.8717 0.2985 0.0236] NA 0.7: Element Radius Y=119 mm, normalizing radius R=35000

Pupil Plane Phase Function Equation $P(r, \theta) = (Y/R)\Sigma a_n r^n$, where n=1 . . . 9, and radius $|r|<=1.0$, and angle $\theta=0$ . . . $2\pi$, where $a_n$=[4.6967−2.7162 1.7921 −0.7771 −0.5688 −1.3528 0.8717 0.2985 0.0236] NA 0.8: Element Radius Y=130 mm, normalizing radius R=45000

Pupil plane function 108 may be implemented by introducing an additional physical optical component, incorporating the phase mask, in the pupil plane of imaging lens 106. In another embodiment, pupil plane function 108 may be introduced by a modification of a lens surface (e.g., lenses 118 and 120) close to the pupil plane.

Figure 15:
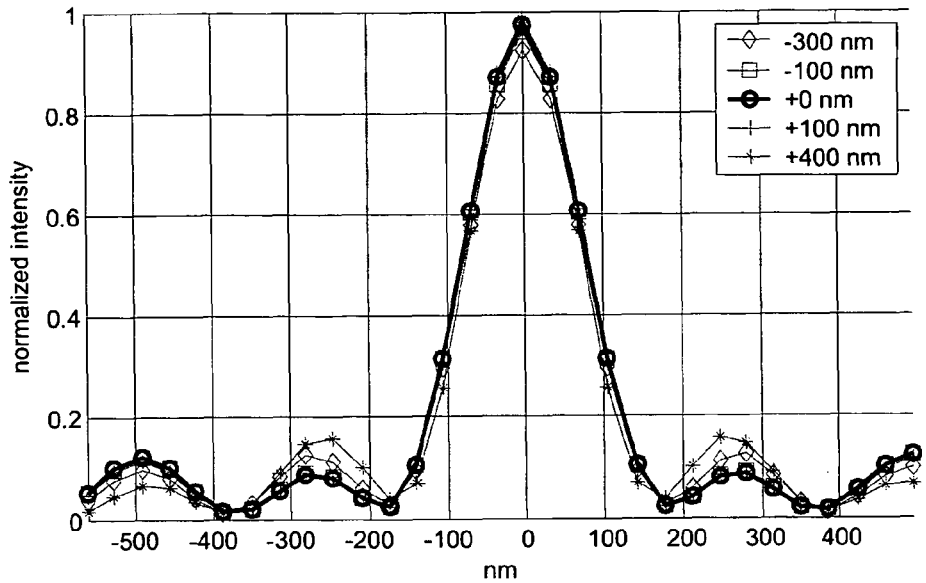
FIG. 15 is a graph illustrating through-focus aerial images of a small hole from the optical lithographic system of FIG. 1 showing an extended depth of focus.

FIG. 15 is a graph 162 illustrating through-focus aerial images of a point from optical lithographic system 100 of FIG. 1 and showing an extended depth of field. Graph 162 shows that for aerial images of a point intensities above an exposure threshold of 0.6, for example, image size varies little with large misfocus. Although aerial images of a point intensities below the exposure threshold vary more, they cause little effect in the recorded image. Further, residual effects may be removed by further modifications of reticle 104 using resolution enhancing techniques (RET) or optical proximity correction (OPC). Thus, PSF intensities below the exposure threshold may also be controlled by modifying reticle 104 to take into consideration the aerial images of a point created by pupil plane function 108.

In certain circumstances, where the combined effects of the aerial images of a point intensities below the exposure threshold add, interfere, or superimpose to form a substantial contribution, such that the combined intensities are recorded, alternative approaches employing image processing to reticle 104 and using RET and OPC techniques may be used. The chosen approach and associated design rules depend on the type of illumination, the behavior of the image, and the particular application. Pupil plane function 108 and reticle 104 may be designed such that the interaction of overlapping aerial images contribute in a positive (or negative) but highly controlled manner to the overall image intensity at periodic intervals, continuous regions, or specific geometrical circuit designs.

Focus-related aberrations increase quadratically with increase of NA; designing and building lithographic imaging systems with large NAs therefore becomes difficult and expensive. In one example, imaging lens originally designed with one NA may be modified to operate at a larger NA by adding an optical element (or modifying a surface of an existing optical element) to incorporate pupil plane function 108. The addition of pupil plane function 108 increases depth of focus, and consequently lessens adverse impact of focus-related aberrations.

Figure 16:
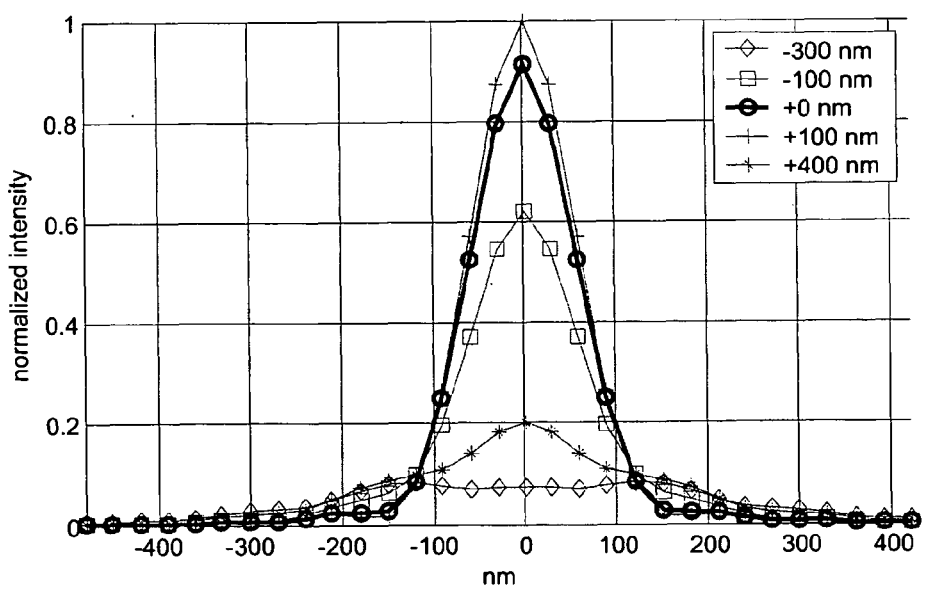
FIG. 16 is a graph illustrating through-focus aerial images of a small hole from a prior art lithographic system with NA increased to 0.8.

For purposes of comparison, FIG. 16 is a graph 163 illustrating through-focus aerial images of a point from a prior art lithographic system with NA increased to 0.8 without any change to the shape or spacing of the lens elements. Aberrations, thus, have not been re-balanced for the increased NA. Graph 163 shows that, in comparison to graph 160, FIG. 13, resolution has been increased with the increase in NA, as expected (note the change of scale on the horizontal axis of graph 162 in comparison with that of graph 160). However, the depth of focus in graph 163 is also smaller than that of graph 160, since depth of focus decreases quadratically with increase in NA.

Figure 17:
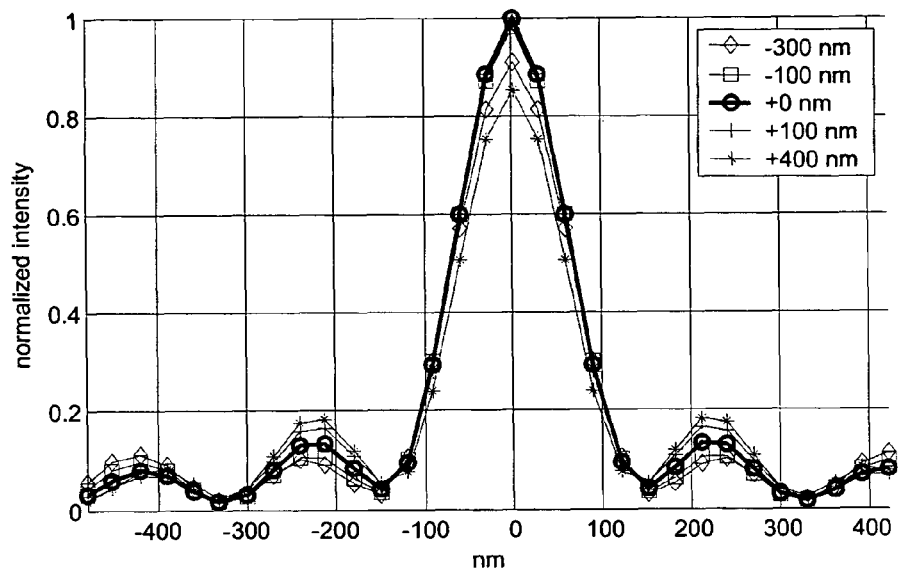
FIG. 17 is a graph illustrating through-focus aerial images of a small hole from the optical lithographic system of FIG. 1 with NA increased to 0.8.

On the other hand, FIG. 17 is a graph 170 illustrating through-focus aerial images of a point from optical lithographic system 100 of FIG. 1 with NA increased to 0.8. FIG. 17 shows that, with the addition of pupil plane function 108, the NA of the lens may be increased to 0.8 with an increase in depth of focus. The portion of graph 170 where the aerial images of a point have intensity greater than the exposure threshold is essentially the same as the in-focus PSF of graph 163, FIG. 16. Thus the inclusion of pupil plane function 108 into imaging lens 106 improves depth of field even when NA is increased, and without reticle modification.

Figure 34:
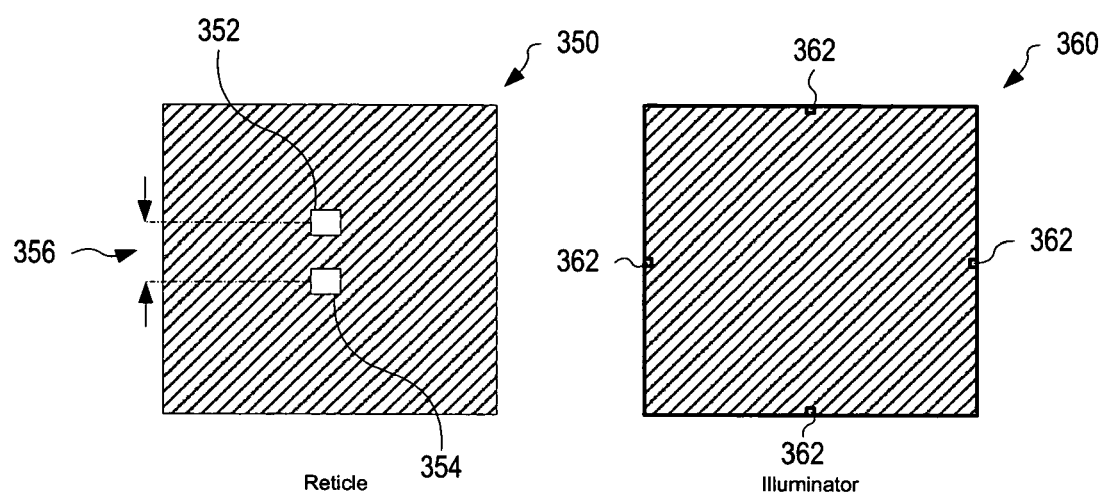
FIG. 34 shows exemplary reticle and illuminator enhancements.

FIG. 34 shows one reticle 350 and one illuminator 360 used to form data and/or images of FIGS. 18, 19, 20, 21, 22 and 23. Illuminator 360 is a rotated quadrupole illuminator with four apertures 362 and reticle 350 includes both phase (e.g., hole 352 includes a 180 degree phase shift) and intensity information (e.g., holes 352 and 354 are each 80 nm square and separated 356 by 130 nm).

Figure 18:
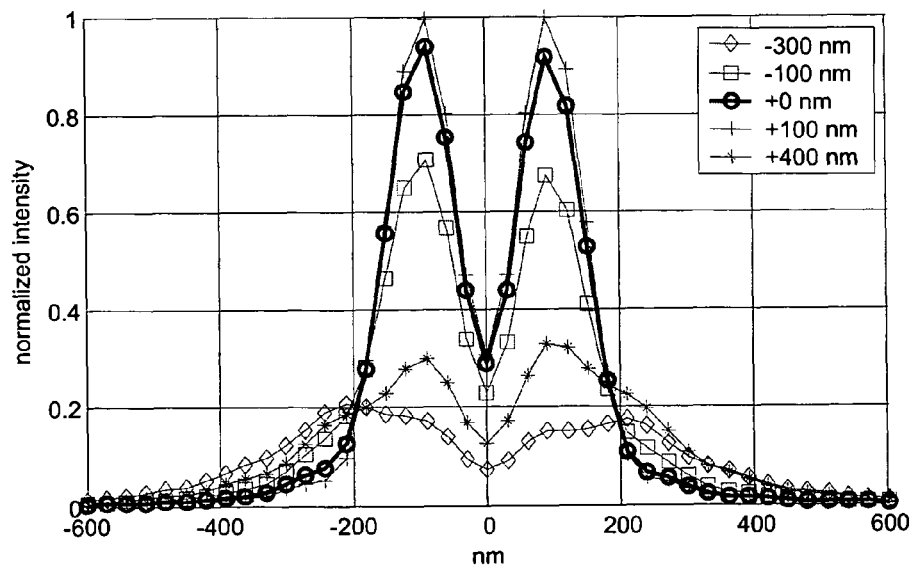
FIG. 18 is a graph illustrating a through-focus double hole aerial image 1D profile from a prior art lithographic system.
Figure 19:
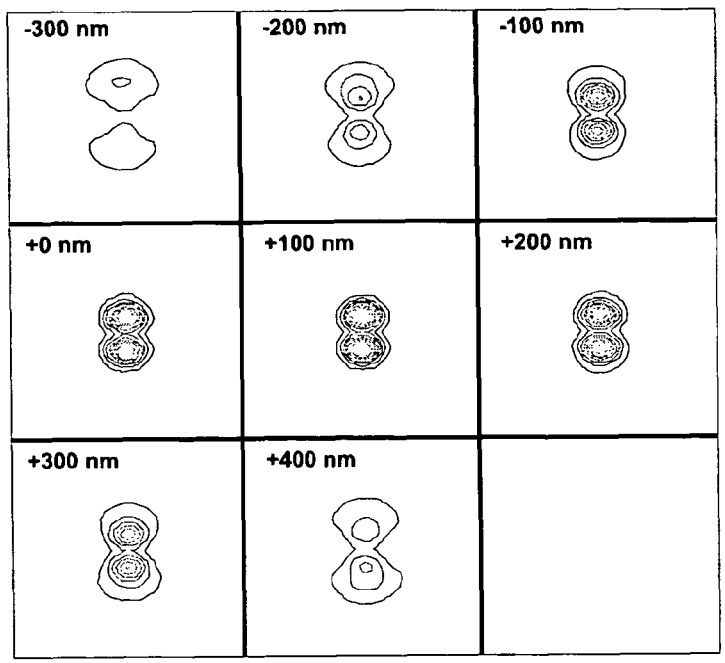
FIG. 19 is a group of images illustrating a through-focus double hole aerial image 2D intensity of a prior art optical lithographic system.
Figure 20:
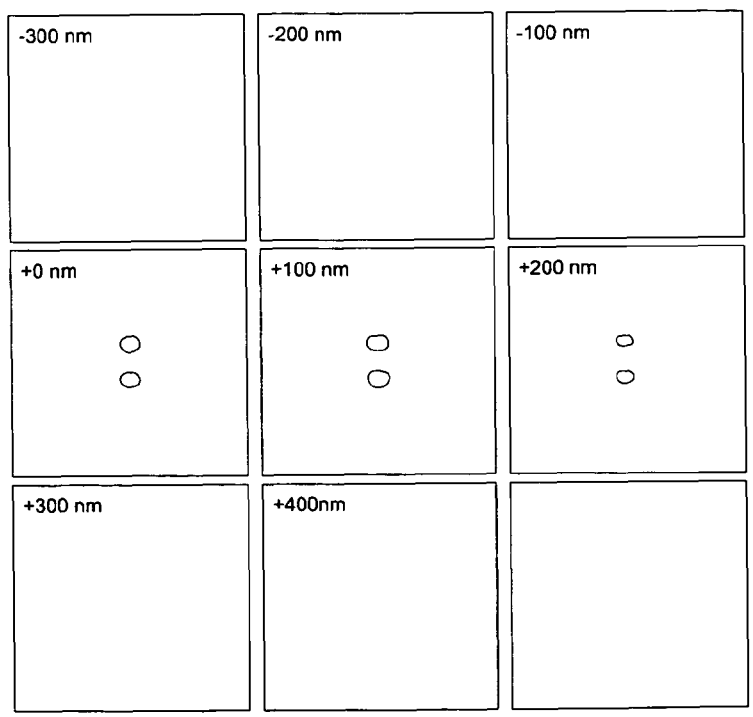
FIG. 20 is a group of images illustrating a through-focus double hole recorded image 2D intensity of a prior art lithographic system.

FIG. 18 is a graph 180 illustrating a through-focus double hole aerial image 1D profile produced from illuminator 360 and reticle 350 by a prior art lithographic optical imaging system. In particular, FIG. 18 shows a cross-section of a simulated aerial image produced by the two holes or vias of reticle 350 using a NA of 0.8, and illuminator 360 with an illumination wavelength of 193 nm. Vias are used to make connections between different levels of an integrated circuit, for example. To increase achievable resolution, holes 352 of reticle 350 has a π phase shift added to the phase of the light passing through that hole (see FIG. 34). Graph 180 illustrates that the aerial image of the two holes is good when in focus, but that the image quickly deteriorates with misfocus. FIG. 19 is a group of images illustrating a through-focus double hole aerial image 2D intensity produced from illuminator 360 and reticle 350 by the prior art optical lithography optical imaging system. In particular, FIG. 19, shows one image for each of −300 nm, −200 nm, −100 nm, 0 nm, +100 nm, +200 nm, +300 nm and +400 nm focus distances, where the image labeled +0 nm represents the in-focus image. Intensity of the aerial image of the two holes varies as focus varies. FIG. 20 shows the images of FIG. 19 as recorded into a highly non-linear photoresist. Note that holes are recorded over a range of only 200 nm, and that correctly sized holes are recorded over a misfocus of only 100 nm.

Figure 21:
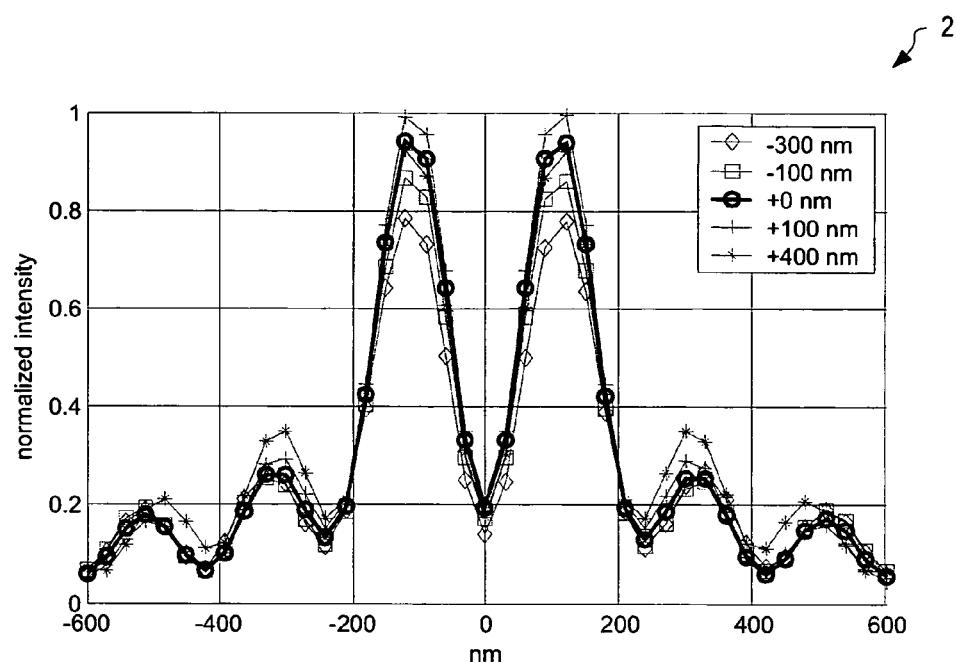
FIG. 21 is a graph illustrating a through-focus double hole aerial image 1D profile from the optical lithographic system of FIG. 1.
Figure 22:
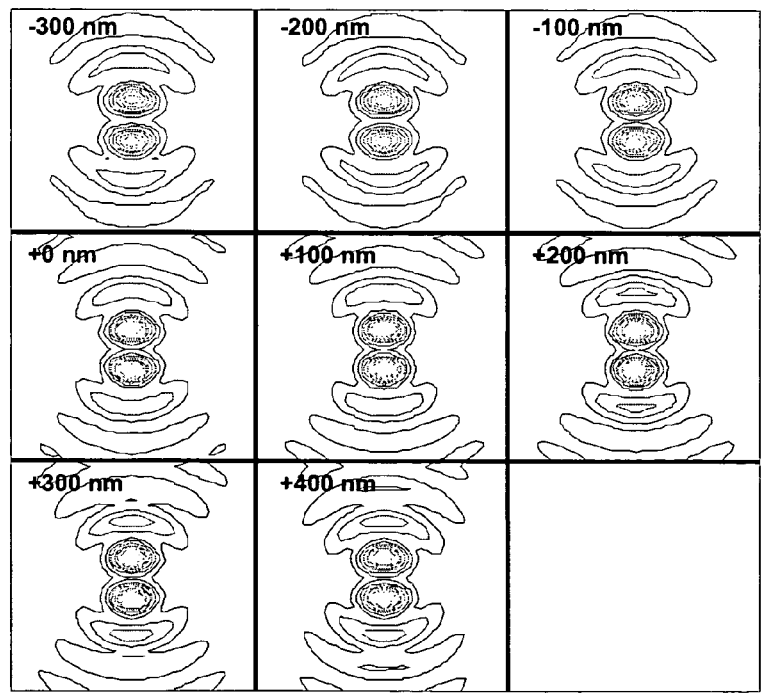
FIG. 22 is a group of images illustrating a through-focus double hole aerial image 2D intensity from the optical lithographic system of FIG. 1.
Figure 23:
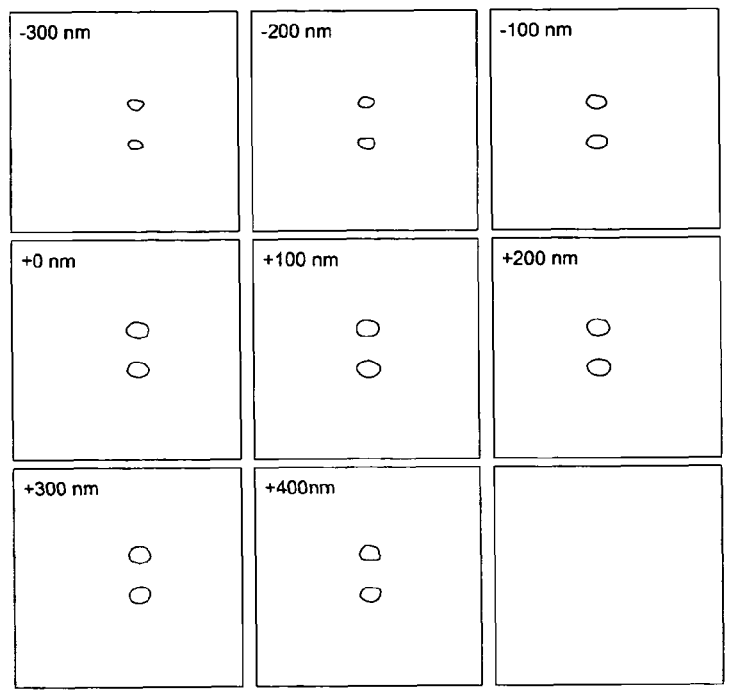
FIG. 23 is a group of images illustrating a through-focus double hole recorded image 2D intensity from the optical lithographic system of FIG. 1.

FIGS. 21, 22 and 23 are produced using illuminator 360 and reticle 350 by optical lithography system 100, FIG. 1, and are comparable to FIGS. 18, 19 and 20. In particular, FIG. 21 shows a graph 210 illustrating a through-focus double hole aerial image 1D profile produced from illuminator 360 and reticle 350 by optical lithography system 100, FIG. 1. As appreciated, graph 210 shows increased depth of field as compared to graph 180, FIG. 18. FIG. 22 shows intensity of the aerial images used to produce graph 210. FIG. 23 shows images recorded by a photoresist with highly non-linear sensitivity of the two holes of reticle 350.

As appreciated, FIGS. 21, 22 and 23 demonstrate that allowable misfocus has been greatly increased without loss of resolution since over a large range of misfocus the recorded portion of the aerial image has the same profile as the in-focus image as shown in FIG. 20. FIG. 23 shows that the holes are recorded over a misfocus range of 300 nm to 400 nm with size and shape constancy occurring over a range more than twice that shown in FIG. 20. Thus, misfocus due to reticle non-flatness, wafer non-flatness, errors in the placement of any of the lithography system components, or for another reason, has increased tolerance when pupil plane function 108 is included in imaging lens 106. System 100 may therefore have increased field of view, and therefore improved throughput, as compared to a traditional lithographic imaging system. Likewise, system 100 may have increased numerical aperture, and therefore improved resolution, as compared with the traditional lithographic imaging system.

Since the use of pupil plane function 108 allows good images to be recorded over a large misfocus range, a larger process window is created, which increases the throughput rate of acceptably exposed wafers. One example of the enlarged process window is shown with Bossung curves and process window curves as shown in FIGS. 24, 25, 26 and 27. A process window in lithography generally includes all processes performed on the wafer (e.g., wafer 110, FIG. 1). However, in the following examples, process window curves and Bossung curves are based on a thresholding resist model and aerial images with normalized intensities.

Figure 24:
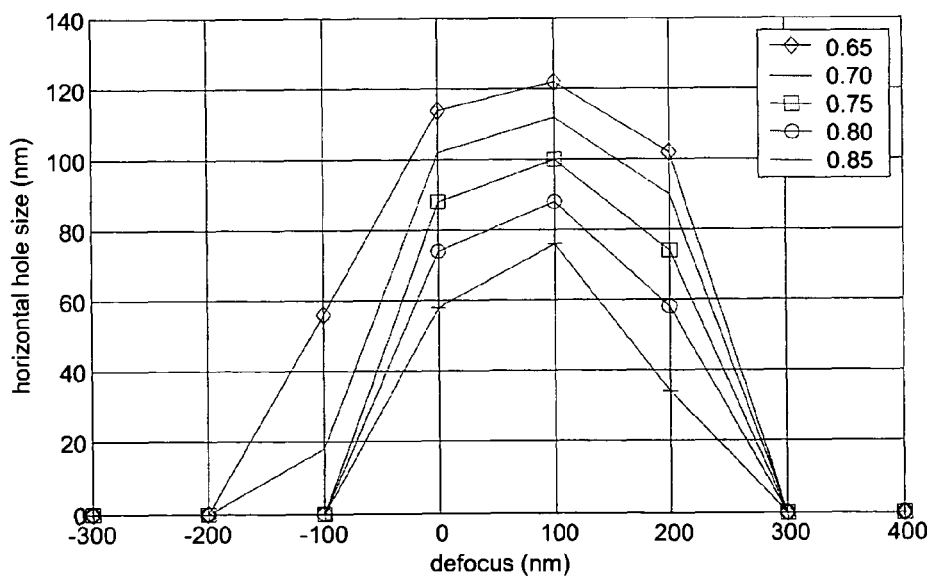
FIG. 24 is a graph illustrating prior art hole sizes, through-focus, for different recording thresholds.
Figure 25:
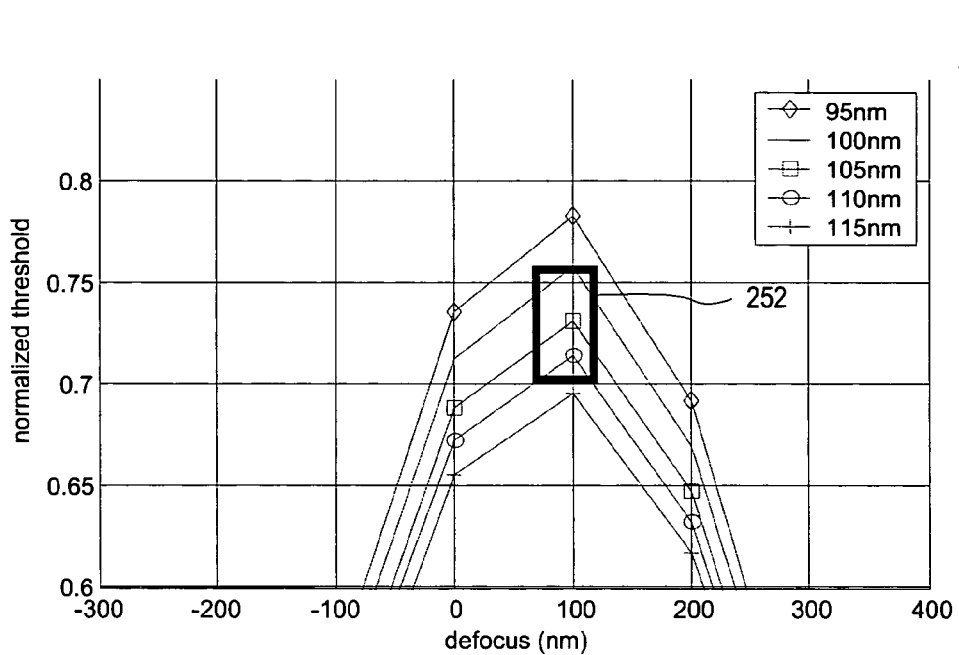
FIG. 25 is a graph illustrating prior art process window, through-focus, across hole sizes for different recording thresholds.

FIG. 24 shows a graph 240 illustrating Bossung curves for a prior art lithographic system where exposure threshold is varied from 0.65 to 0.85 and aerial image intensity is normalized to a maximum intensity of 1.0. FIG. 25 shows a graph 250 illustrating process window curves for a prior art lithographic system when the acceptable hole size is varied from 95 nm to 115 nm.

Figure 26:
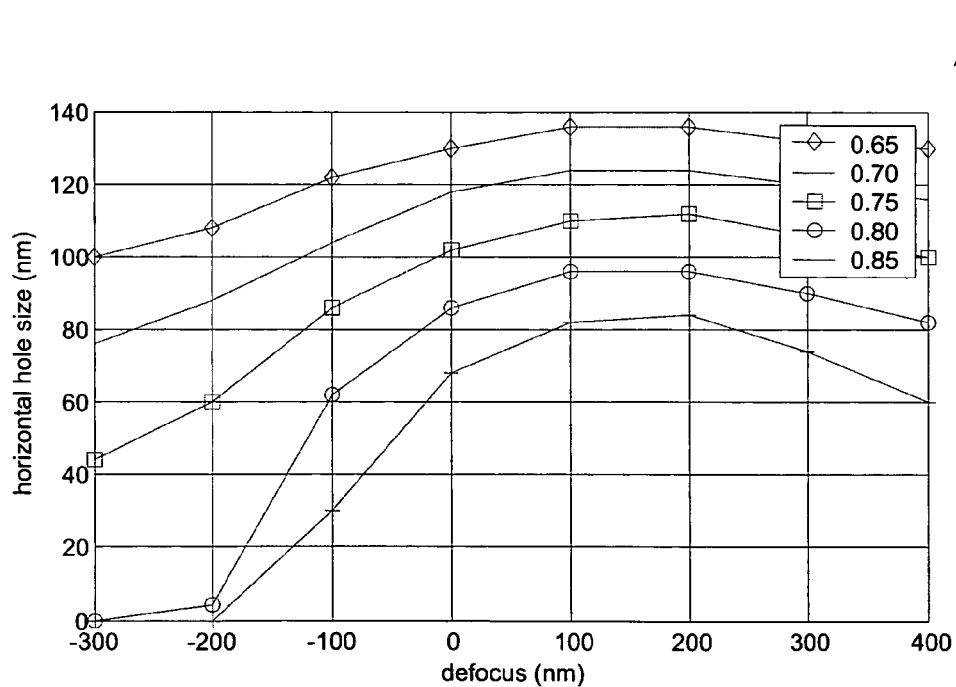
FIG. 26 is a graph illustrating hole sizes, through-focus, for different recording thresholds in the optical lithographic system of FIG. 1.
Figure 27:
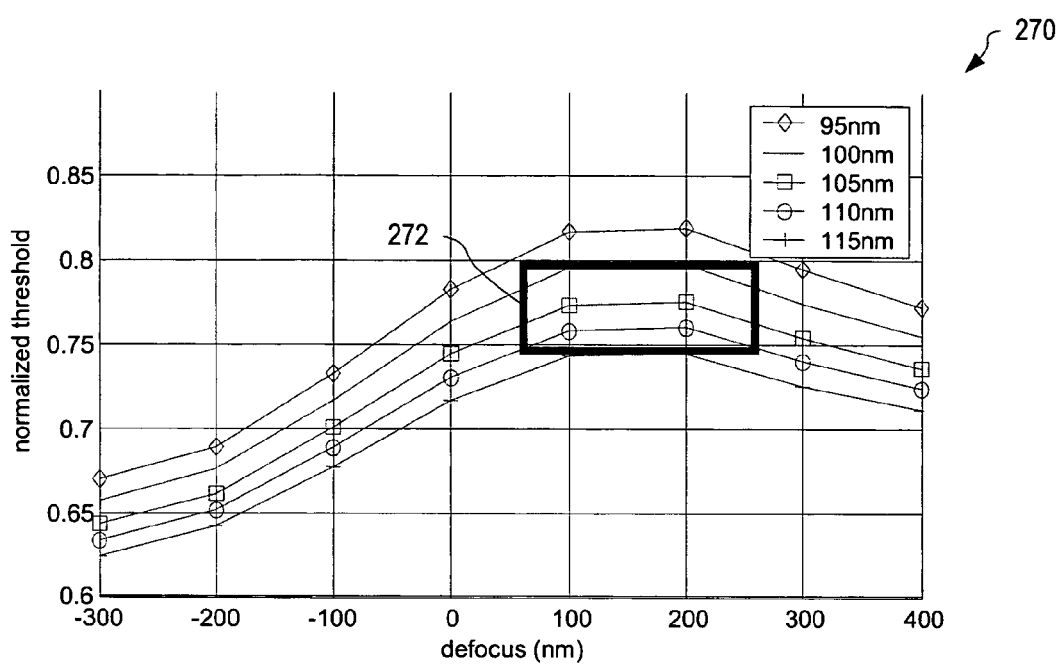
FIG. 27 is a graph illustrating process window curves, through-focus, across hole sizes for different recording thresholds in the optical lithographic system of FIG. 1.

FIG. 26 shows a graph 260 illustrating Bossung curves for optical lithography system 100, FIG. 1, using the same thresholding and normalization characteristics a used with FIG. 24. FIG. 27 shows a graph 270 illustrating process window curves for optical lithography system 100, FIG. 1, using the same thresholding and normalization characteristics a used with FIG. 25. FIGS. 26 and 27 are thus comparable to FIGS. 24 and 25, respectively. With regard to FIG. 1, the increased process window means that tolerances associated with (a) assembly of the lithographic system 100, (b) stepper motor accuracy, (c) flatness of reticle 114 or object mask forming reticle 114, and/or (d) flatness of wafer 110 may be relaxed without loss of resolution.

For acceptable hole sizes of 100 nm to 110 nm, a process window 252 is shown in graph 250 and a process window 272 is shown in graph 270. Although process window 272 is slightly shorter in height than process window 252, the area enclosed within process window 272 is much larger than the area enclosed in process window 252; and process window 272 is a 200 nm wide window whereas process window 252 is less than 100 nm wide. Process window 272 thus shows greater defocus capability that process window 252 in this example.

Figure 28:
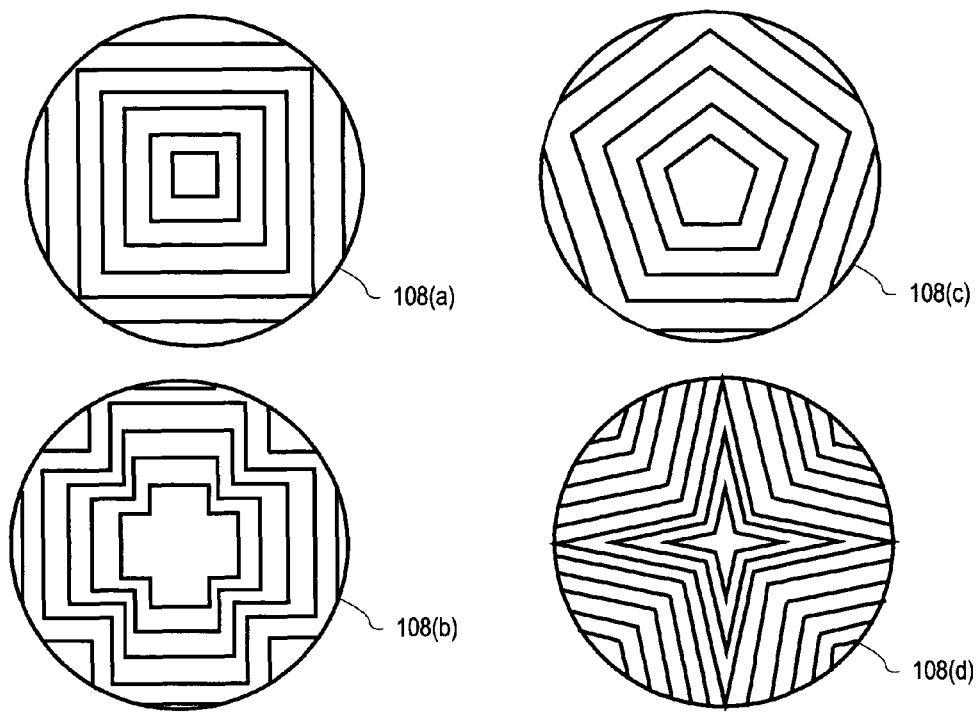
FIG. 28 illustrates four pupil plane functions showing lenses with contour lines of constant phase.

Pupil plane function 108 is not limited to the pupil plane phase function illustrated in FIG. 14; other pupil plane phase functions may be used to increase depth of focus in optical systems. For example, three families of optical surfaces that may be used to increase the depth of focus, each with different effects are: (a) cubic surfaces, (b) cosine form surfaces, and (c) constant profile path surfaces. These surfaces may be included in an imaging lens (e.g., lens 106) on separate optical elements or may be included as modifications of existing element surfaces, to form pupil plane function 108. For example, the family (c) "constant profile path surface" family produces considerably different phase functions as compared to families (a) and (b). FIG. 28 illustrates four exemplary pupil plane functions 108(a)-108(d) showing lenses with constant profile path surfaces. Combinations of families can also be used.

Figure 29:
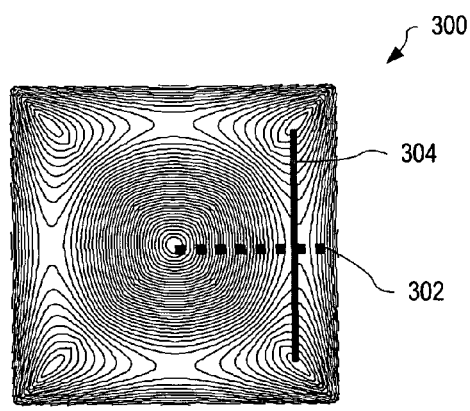
FIG. 29 illustrates an intermediate result while deriving a constant-path profile surface, highlighting across-path and along-path slices plotted in FIGS. 30 and 31.

FIGS. 29, 30 and 31 illustrate how phase function for a constant-profile-path surface may be described by two functions where one function describes the variation out from the center along the horizontal axis (see line 302), and the other function describes the variation along a path at a given distance from the origin (see line 304). Commonly-owned and copending U.S. patent application Ser. No. 10/376,924, entitled "Optimized Image Processing for Wavefront Coded Imaging Systems", is thus incorporated herein by reference for more information on descriptions and design of specialized phase functions. FIG. 29 shows a constant profile path surface 300 for an exemplary pupil plane function illustrating an across path line 302 and an along path line 304. FIG. 30 is a graph 310 illustrating magnitude of across-path line 302, for a phase function of a constant-profile-path surface 300. FIG. 31 is a graph illustrating height in waves for along path line 304 of constant profile path surface 300.

The process of using an optical surface with a constant profile along a path to design a specialized Optical Transfer Function (OTF) or its magnitude, the Magnitude Transfer Function (MTF), is illustrated in FIGS. 29, 30, 31, 32 and 33. In FIG. 30 the multiplier for the profile along each path is shown in the plot of magnitude as a function of distance from the origin along the horizontal axis. FIG. 31 shows the variation in surface height along one path 304. Profile 300 shows the intermediate two-dimensional phase profile based on these polynomials. Profile 300 is then multiplied by a second-order radial function to generate a final profile 330, as shown in FIG. 32. Profile 330 provides a phase modification to an imaging system to increase depth of focus. Profile 330 is shown with contours of constant phase for a phase function that modifies the optical system such that its depth of focus is increased and its MTF is as shown in profile 340, FIG. 33. Profile 340 is show with contour of constant transmission. These contours of constant transmission as a function of the two-dimensional spatial frequencies show that the modified optical system passes the spatial frequencies along the vertical and horizontal axes at a higher level than it does for the off-axis spatial frequencies. Since most integrated circuits have lines parallel to the x- and y-axes (Manhattan geometry), most of the signal energy in the image lies along these corresponding axes in the two-dimensional spatial frequency domain. Alternative geometries could be optimally reproduced by using different pupil plane phase functions optimized for their particular geometry. In practice the use of multiple phase surfaces integrated onto a single optical element, or a multiplicity of optical elements, allow a high degree of system optimization. Pupil plane function 108 may be implemented such that spatial frequencies associated with the photomask or reticle are a maximum in the system's two-dimensional optical transfer function.

The equations for the surface form components of FIGS. 29, 30 and 31 are polynomials in a radial direction (curve 312) and in a vertical and horizontal direction (curve 322). The polynomial for curve 312 is:

$$P(r)=-0.0784r^3-0.1094r^2-0.8245r+0.8220,$$

where r=0 to +1 and the polynomial for curve 322 is:

$$P(y)=2.8776y^2+0.7908,$$

where y=−1 to +1

By Hadamard multiplication (element-by-element) of two shapes, where P(r) is one shape with r defined above, and with P(y) the second shape, which is formed by scaling the 2″ order polynomial to fit between adjacent diagonals, the surface 300 is obtained. Line 304 indicates the polynomial shape generated by P(y) where it has been scaled to fit between the diagonals; and line 302 indicates the polynomial shape generated by P(r). Addition of surface 300 to another surface $S(x,y)=0.8034(x^2+y^2)$ which is also zero outside of $1.0<\sqrt{(x^2+y^2)}$, yields final pupil plane phase function 330 as shown in FIG. 32. The corresponding MTF 340 for the pupil plane phase function 340 is shown in FIG. 33.

System 100, FIG. 1, is for example useful in forming vias within integrated circuits. In particular, aerial image 122 may form one or more sharp point images (essentially point spread functions) that vary little with misfocus (and thereby alignment and/or manufacturing tolerances of system 100), to create the vias in photoresist material 122. This is made possible, in part, due to optical system response function of system 100, which has no zeros over the useful range of misfocus. This range of misfocus further provides the wider, more useful lithographic process window. By processing photoresist in the disclosed techniques, a degree of nonlinearity is obtained that is useful, for example, in setting thresholding of the aerial image with the photoresist. The extended depth of focus of system 100 also allows deeper holes to be made in the photoresist.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. Apparatus for increasing the depth of focus in a lithographic system, comprising:
   optics for imaging a reticle or photomask onto a lithographic recording medium having a threshold of exposure;
   a pupil plane function that alters an aerial image of a lithographic imaging system such that part of the aerial image is above a recording threshold of the lithographic recording medium over the extended depth of focus, the pupil plane function altering a system response function and the aerial image by affecting phase of a wavefront imaged by the optics.

2. Apparatus of claim 1, wherein the pupil plane function and the reticle or photomask alter the system response function.

3. Apparatus of claim 1, further comprising an illumination source selected from the group of incoherent source, annular source, fourfold source, separated source, quadrupole source, CQUAD source, QUASAR source, dipole source.

4. Apparatus of claim 3, the illumination source generating coherent or partially coherent illumination.

5. A method of increasing the process window for lithography, comprising:
 illuminating a reticle; and
 imaging a wavefront of the reticle to an aerial image by altering phase of the wavefront such that aerial image has extended depth of focus and an increased process window size as compared to an aerial image formed without altering of the wavefront phase.

6. The method of claim 5, the step of imaging implemented to maintain an essentially in-focus aerial image of a point object throughout the extended depth of focus.

7. The method of claim 5, the step of imaging implemented such that the aerial image provides a substantially constant threshold for a lithographic recording medium over the depth of focus.

8. The method of claim 7, the step of imaging implemented such that the aerial image of a point object is substantially unchanged for the entire reticle.

* * * * *